US009893076B2

(12) United States Patent
Rhie

(10) Patent No.: US 9,893,076 B2
(45) Date of Patent: Feb. 13, 2018

(54) ACCESS TRANSISTOR OF A NONVOLATILE MEMORY DEVICE AND METHOD FOR FABRICATING SAME

(71) Applicant: Conversant Intellectual Property Management Inc., Ottawa (CA)

(72) Inventor: Hyoung Seub Rhie, Ottawa (CA)

(73) Assignee: CONVERSANT INTELLECTUAL PROPERTY MANAGEMENT INC., Ottawa (CA)

( * ) Notice: Subject to any disclaimer, the term of this patent is extended or adjusted under 35 U.S.C. 154(b) by 56 days.

(21) Appl. No.: 14/614,811

(22) Filed: Feb. 5, 2015

(65) Prior Publication Data
US 2016/0233224 A1 Aug. 11, 2016

(51) Int. Cl.
  *H01L 27/115* (2017.01)
  *H01L 27/1157* (2017.01)
  *H01L 27/11582* (2017.01)
  *H01L 27/11565* (2017.01)

(52) U.S. Cl.
  CPC .... *H01L 27/1157* (2013.01); *H01L 27/11565* (2013.01); *H01L 27/11582* (2013.01)

(58) Field of Classification Search
  CPC ......... H01L 27/11524; H01L 27/11556; H01L 27/1157; H01L 27/11582; H01L 27/11568; H01L 27/11563; H01L 27/1156; H01L 27/11551; H01L 27/11553; H01L 27/11521
  See application file for complete search history.

(56) References Cited

U.S. PATENT DOCUMENTS

| 2010/0181612 | A1* | 7/2010 | Kito | H01L 27/11551 257/319 |
| 2012/0068255 | A1* | 3/2012 | Lee | H01L 27/11582 257/324 |
| 2012/0199877 | A1* | 8/2012 | Liu | H01L 27/1158 257/192 |
| 2015/0055413 | A1* | 2/2015 | Alsmeier | G11C 14/0018 365/185.08 |

(Continued)

OTHER PUBLICATIONS

H. Tanaka et al., Bit Cost Scalable Technology with Punch and Plug Process for Ultra High Density Flash Memory, VLSI Technology, 2007 IEEE Symposium on VLSI Technology, Jun. 12-14, 2007.

(Continued)

*Primary Examiner* — Cheung Lee
*Assistant Examiner* — Stephen C Smith
(74) *Attorney, Agent, or Firm* — Conversant IP Management Corp

(57) ABSTRACT

A three-dimensional integrated circuit nonvolatile memory array includes a memory array of vertical channel NAND flash strings connected between an upper layer connection bit line and a substrate which includes one or more elevated source regions disposed on at least one side of each row of NAND flash strings so that each NAND flash string includes a lower select transistor with a first channel portion that runs perpendicular to the surface of the substrate through a vertical channel string body, a second channel portion that runs parallel to the surface of the substrate, and a third channel portion that runs perpendicular to the surface of the substrate through the elevated source region.

19 Claims, 15 Drawing Sheets

(56) References Cited

U.S. PATENT DOCUMENTS

2016/0163729 A1* 6/2016 Zhang .............. H01L 27/11582
257/321
2016/0181272 A1* 6/2016 Rabkin ............. H01L 21/02653
438/268

OTHER PUBLICATIONS

J. Jang et al., Vertical Cell Array using TCAT(Terabit Cell Array Transistor) Technology for Ultra High Density NAND Flash Memory, VLSI Technology, 2009 Symposium on VLSI Technology, Jun. 16-18, 2009.
Y. Fukuzumi et al., Optimal Integration and Characteristics of Vertical Array Devices for Ultra-High Density, Bit-Cost Scalable Flash Memory, 2012 IEEE International Electron Devices Meeting, IEDM Dec. 10-12, 2007.

* cited by examiner

ACCESS TRANSISTOR OF A NONVOLATILE MEMORY DEVICE AND METHOD FOR FABRICATING SAME

BACKGROUND OF THE INVENTION

Field of the Invention

The present invention is directed in general to integrated circuit devices and methods for manufacturing same. In one aspect, the present invention relates to nonvolatile memory devices, such as NAND flash memory and other types of flash memory.

Description of the Related Art

With the increasing demand for nonvolatile data storage in consumer electronics having mass storage, such as video or audio players, digital cameras, and other computerized devices, there continues to be interest in having nonvolatile memory devices progress over time towards having smaller sizes, larger memory capacity, and improved performance. Flash memory is a commonly used type of nonvolatile memory which can take the form of memory cards or USB type memory sticks, each having at least one memory device and a memory controller formed therein. For example, the need to reduce manufacturing costs per data bit is driving the NAND flash industry to continuously reduce the size of the cell transistors. But as fabrication process limitations (for example, limitations imposed by photolithography tools) limit the ability to reduce physical transistor sizes, there have been structural and/or design schemes proposed to increase memory density, such as, for example, stacking NAND cells in a direction perpendicular to the chip surface, thereby reducing the effective chip area pet: data bit without requiring shrinkage of the physical cell transistor size. However, there continue to be challenges associated with designing, fabricating, and operating vertical NAND flash memory devices.

BRIEF DESCRIPTION OF THE DRAWINGS

The present invention may be understood, and its numerous objects, features and advantages obtained, when the following detailed description is considered in conjunction with the following drawings, in which:

FIG. 1b illustrates a simplified cross sectional view of the NAND flash memory cell transistors shown in FIG. 1a;

Figure 1A:
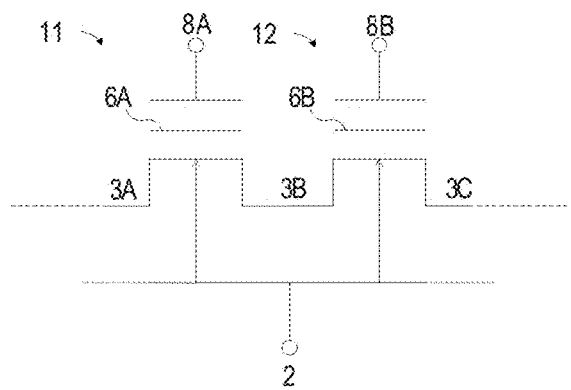
FIG. 1a illustrates a simplified circuit schematic representation of two serially-connected NAND flash memory cell transistors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

In three-dimensional vertical channel nonvolatile memory device, a stacked memory architecture and cell array structure are provided having select transistors with elevated substrate layers to form extended source line regions to provide improved turn-off characteristics for the select transistors. In selected embodiments, the elevated substrate layers are formed with epitaxial semiconductor strips which extend in the word line direction on both sides of a around select access transistor gate electrode and separated therefrom by an insulating gate dielectric layer. Each epitaxial semiconductor strip may have at least a portion formed with a specified doping type (e.g., n-type) or a highly doped conductive or silicide upper source region to define a source region which is positioned in overlap with the ground select access transistor gate electrode. By connecting the flash cell strings between the upper connection bit lines and an n-type elevated source region protruding from the substrate, the transistors on each string may include a plurality of series-connected transistors, including a string select transistor having a drain which is electrically connected to the upper connection bit line node and a source which is connected to one out of multiple cell transistors connected in series through a ground select transistor to the n-type elevated source region protruding from the substrate. In selected embodiments, each elevated source region protruding from the substrate is connected across a plurality of source contacts to a shared metal interconnect source line running in the word line direction, such as by depositing, patterning, and etching one or more dielectric layers over the elevated source region to form a plurality of source contact openings that expose the elevated source region, filling the source contact openings with one or more conductor layers to define the plurality of source contacts which are laterally spaced apart from the vertical flash cell strings, and then forming the shared metal interconnect source line with one or more patterned or damascene conductor layers. In other embodiments, each elevated source region is connected to a single, elongated metal interconnect source line running in the word line direction, such as by depositing, patterning, and etching one or more dielectric layers over the elevated source region to form a source contact opening that exposes the elevated source region, and then filling the source contact opening with one or more conductor layers to define the shared metal interconnect source line. By forming each flash cell string with a bottom body portion using a monocrystalline or polycrystalline pillar structure which extends from and/or contacts the substrate, each select transistor formed at the bottom of the flash cell string is provided with elongated, U-shaped channel regions which surround the select transistor gate electrode, thereby improving turn-off characteristics for the select transistors.

In this disclosure, an improved system, apparatus, and fabrication method are described for fabricating vertical channel nonvolatile memory devices with elevated source regions protruding from the substrate to surround, but not contact the transistor gate electrode of the bottom select transistors in each cell string that address various problems in the art where various limitations and disadvantages of conventional solutions and technologies will become apparent to one of skill in the art after reviewing the remainder of the present application with reference to the drawings and detailed description provided herein. For example, there are performance limitations with vertical channel nonvolatile memory devices where the lower select gates have unsatisfactory cut-off characteristics and leakage current when turned off with the corresponding cell strings unselected, thus causing an overall large leakage current from the bit lines to the source regions formed in the substrate below each string. These performance limitations may be exacerbated when the cell string transistors are formed with polysilicon bodies which have worse turn-off characteristics than monocrystalline silicon transistors. Various illustrative embodiments of the present invention will now be described in detail with reference to the accompanying figures. While various details are set forth in the following description, it will be appreciated that the present invention may be practiced without these specific details, and that numerous implementation-specific modifications may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings and representations of a flash memory device without including every device feature, geometry, or circuit detail in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art how to make or use the present invention.

To provide a contextual framework for selected embodiments of the present disclosure, reference is now made to FIG. 1a which illustrates a simplified circuit schematic representation 1 of two serially connected NAND Flash cell transistors 11, 12. Each of the transistors 11, 12 includes a control gate 8A, 8B and a floating node (or storage nodes) 6A, 6B. Source/drain nodes 3A, 3B, 3C and the cell body node 2 are also shown. The NAND flash memory cell transistors 11, 12 can perform erase, program, and read operations by applying appropriate voltages to the indicated nodes, thereby trapping electrons in the charge storage nodes 6A, 6B to modify the threshold voltage of each cell transistor to different levels, depending on the data (0 or 1) stored in the cell. The threshold voltage of each cell transistor determines the resistance of the corresponding channel 4A, 4B. In selected embodiments where each NAND Flash memory cell stores two logic states (data '1' and data '0'), each memory cell corresponds to one bit, but in other embodiments where NAND Flash memory cells can be programmed to four or more threshold levels, multiple bits can be stored in each physical cell, which is referred to as a multi-level cell (MLC). With NAND flash memory cells, data is typically erased and programmed using Fowler-Nordheim (F-N) tunneling to deliver or remove charge from the floating gate/charge storage nodes 6A, 6B by applying a suitably large voltage to the control gate 8A, 8B (for example, 20V) while holding the substrate 2 and source/drain regions 3 to a lower voltage (for example, ground or 0V) to induce the formation of a channel 4A, 4B under the tunnel dielectric 5 which injects electrons into the floating gate/charge storage nodes 6A, 6B. As a result, the cell threshold voltage Vth of the programmed cell is shifted in the positive direction.

In order to read cell data, the control gate 8A, 8B is biased to a lower voltage (for example, Vss=0V). If the cell is in an erased state, the erased cell has a negative threshold voltage so that the cell current (Icell) from the drain 3B to the source 3A flows under the given read bias condition. On the other hand, if the cell is in a programmed state, the programmed cell has a positive threshold voltage so that there is no cell current from the drain 3B to the source 3A under read bias condition. An erased cell (on-cell) is thus read or sensed as data '1' and a programmed cell (off-cell) is read or sensed as data '0'.

During an erase operation, the control gate 8A, 8B of a cell is biased to a low voltage (for example, Vss=0V) while the cell body 2 is biased to an erase voltage V_erase (for example 18 V) and the source and drain 3A/3B of the cell are floated. In the erase bias conditions, no conductive inversion layer channel 4A, 4B exists because the cell transistors are strongly turned off, in which case the trapped electrons in the floating node 6A, 6B are emitted uniformly to the substrate 2 through the tunnel dielectric 5. As a result, the cell threshold voltage (Vth) of the erased cell becomes negative. In other words, the erased cell transistor is in an on-state if the gate bias of the control gate is 0V. Because of the cell body bias requirement for erase bias conditions, erase operations are not applied to individual NAND Flash memory cells, but are instead applied to erase entire blocks of cells.

Figure 1B:
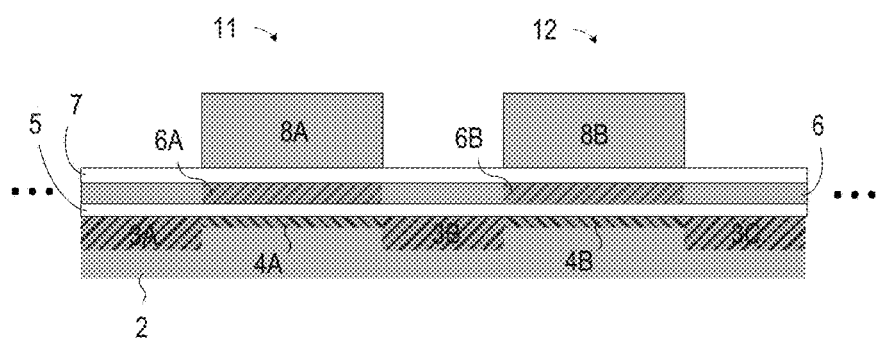

To further illustrate the contextual framework for selected embodiments of the present disclosure, reference is now made to FIG. 1b which illustrates a simplified cross sectional view of the NAND flash memory cell transistors 11, 12 shown in FIG. 1a formed in a semiconductor substrate or string structure. The illustrated NAND Flash cell includes a semiconductor body or well layer 2 formed with an appropriate semiconductor material (for example, monocrystalline or polycrystalline silicon) having a first polarity type (for example, p-type silicon), such as a bulk semiconductor substrate, semiconductor-on-insulator (SOI) substrate, or a polysilicon layer. Multiple semiconductor substrate or string structures can be vertically stacked over a bulk or SOI substrate and separated from one another by interlayer dielectric layers.

On or around the semiconductor body or well layer 2, a multi-layered memory film structure 5-7 is formed for each transistor 11, 12, including a tunnel dielectric layer 5 that is formed (for example, deposited or grown) on the semiconductor body/well layer 2, a charge storage layer 6 that is formed (for example, deposited) on the tunnel dielectric 5, and a coupling dielectric 7 (a.k.a., blocking dielectric) that is formed (for example, deposited) on the charge storage layer 6. Sandwiched between the tunnel dielectric layer 5 and the coupling dielectric layer 7, the charge storage layer 6 performs a charge trap function by including charge storage nodes or locations 6A, 6B where electrons are trapped. In selected embodiments, the charge storage nodes 6A, 6B may be formed as a SONOS (Silicon-Oxide-Nitride-Oxide-Silicon) structure, though other charge storage node structures may be used. As will be appreciated, the charge storage nodes 6A, 6B are formed to prevent unintentional charge flow between adjacent cells, such as by forming the charge storage layer 6 with dielectric charge trapping material or with conductive material in each cell which is isolated from adjacent cells (e.g., by patterned dielectric layers between adjacent floating gates). In selected floating gate embodiments (not shown), the charge storage layer 6 is patterned into separate floating gates that are isolated from one another. However, in embodiments where the charge storage layer 6 and storage nodes 6A, 6B are formed as a single continuous layer, the multi-layered memory film structure 5-7 may be fabricated as a continuous thin film without patterned, isolated segments. On the multi-layered memory film structure 5-7, patterned control gates 8A, 8B are formed, such as by depositing a polysilicon layer or other conductive control gate layer on the coupling dielectric 7.

In the semiconductor body/well layer 2, source/drain regions 3A-3C are formed using any desired technique. For example, the source/drain regions 3 may be formed by implanting or diffusing regions with appropriate polarity dopants (for example, n-type doping). In other embodiments, the source/drain regions 3 are not formed through ion implantation as permanently conducting implant regions, but instead have their conductivity controlled by applying electric fringe-fields from the control gates 8A, 8B. For example, a large bias applied at the control gates 8A, 8B can induce conductive inversion layers in the source/drain regions 3A-3C in the same manner as a channel inversion layer forms when a transistor is turned on. These types of cells are called "junction-free" or "junctionless" cells. In such junction-free cells, the channel regions 4A, 43 and the source/drain regions 3A, 3B, 3C are only conductive if the electric field between the charge storage node 6A, 6B and the substrate 2 is sufficiently large to induce an inversion layer. This electric field is caused by a combination of the charge stored in the charge storage layer 6A, 6B and the external bias that is applied to the control gate 8A, 8B.

Figure 2:
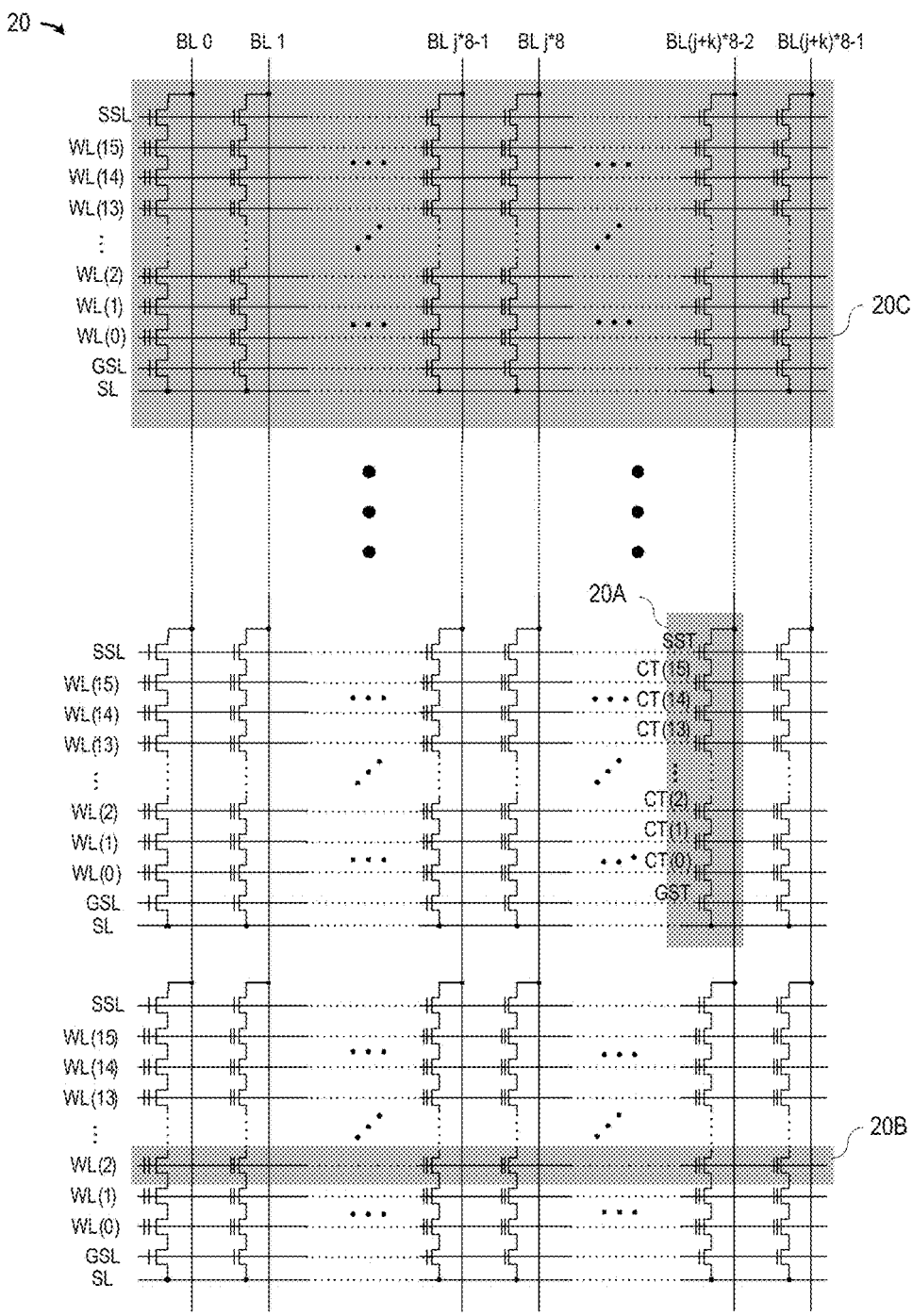
FIG. 2 illustrates a simplified circuit schematic representation of a NAND flash memory cell array in which a string, page, and block of data are identified.

Turning now to FIG. 2, there is shown a simplified circuit schematic of a plurality of NAND flash memory cells organized and arrayed into multiple rows and columns, where each column is connected to a respective bit line conductor (for example, BL0-BL(j+k)*8−1) and each row is connected to a respective word line conductor (for example, WL(0)-WL(15)). As depicted, the NAND flash memory cell array 20 can be subdivided into data strings, data pages, and data blocks, as illustrated by examples of a data string 20A, data page 203, and data block 20C.

In the depicted NAND string 20A, the cells are connected in series in a group of a predetermined numbers of cells (for example, 16, 32 or 64). To connect each string to its corresponding source line (SL) and bit line (for example, BL(j+k)*8−2), selection transistors are placed at the edges of the string. For example, the NAND cell string 20A includes at least one string select transistor (SST, SSL gate or SSL transistor) and at least one ground select transistor (GST, GSL gate or GSL transistor). The gate of the string select transistor (SST) is connected to a string select line (SSL), while the drain of a string select transistor (SST) is connected to a bit line for the string (for example, BL(j+k)*8−2). The gate of a ground select transistor (GST) is connected to a ground select line (GSL), while the source of the ground select transistor (GST) is connected to a source line (SL or CSL) for the string. Connected in series between the string select transistor SST and ground select transistor GST is a plurality of memory cell transistors CT(i), each having a control gate connected to a respective word line WL(i). In the depicted configuration, the NAND string 20A shares the bit line contact with another string, and any desired number of memory cell transistors may be connected in a string so that the number of cells per string may vary with 4 cells per string, 8 cells per string, 16 cells per string, 32 cells per string, 64 cells per string, 128 cells per string, and so on. To specify a direction within the string 20A, the direction towards the string select line SSL of a string is referred to as "drain direction" or "drain side," and the direction towards the ground select line GSL of a string is referred to as "source direction" or "source side."

In the depicted NAND page 20B, the cells are addressed by a row address to specify the smallest unit of cells for which a read or program operation can be performed. In selected embodiments, the page 20B includes the cells connected to the same word line (for example, WL(2)). In other embodiments, the number of pages per word line depends upon the storage capabilities of the memory cell. For example, the cells connected to a certain word line may be subdivided into multiple subgroups so that the array 20 includes multiple pages per word line, whereby each one of the multiple pages in one word line has a different row address. In the case of multiple bit storage in one physical cell, different bits can belong to different pages although they are physically located in the same cell transistor and thus connected to the same word line.

The NAND Flash array 20 may also be grouped into a series of blocks (for example, 20C). For example, the depicted NAND flash block 20C includes all strings which share the same word lines, string select lines, and ground select lines. Stated another way, a block 20C includes all pages sharing the same string select lines and ground select lines. In other embodiments, different groupings of NAND flash cells may be used for the flash erase blocks. In selected embodiments, the smallest unit for which an erase operation is performed is one cell block, which is therefore often named "erase block."

Figure 3:
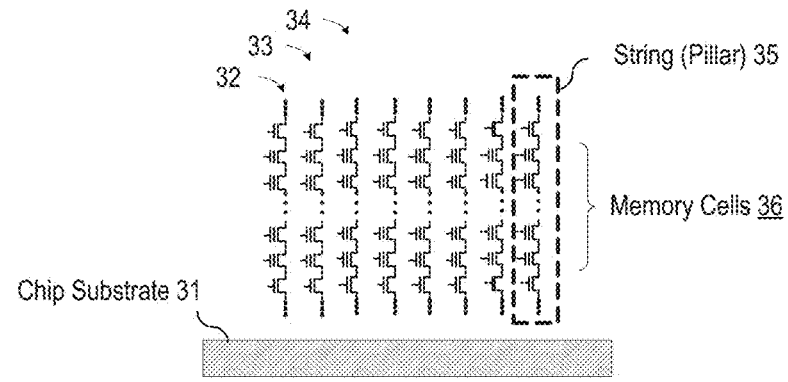
FIG. 3 illustrates a simplified cross-sectional schematic representation of a vertically stacked array of vertical channel NAND flash cell strings formed over a substrate.
Figure 4:
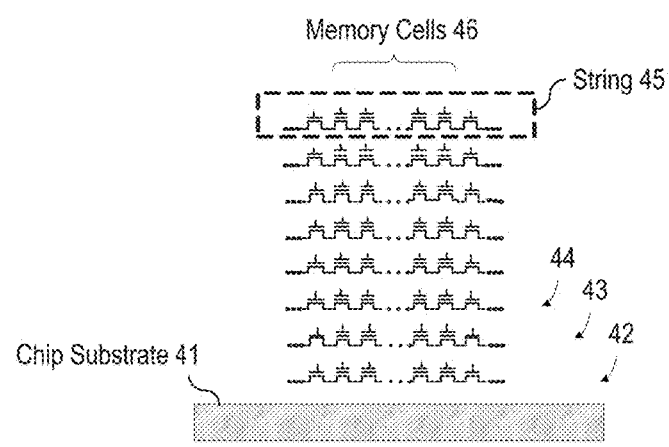
FIG. 4 illustrates a simplified cross-sectional schematic representation of a vertically stacked array of vertical gate NAND flash cell strings formed over a substrate.

As memory array sizes increase, the need to reduce manufacturing costs per data bit is driving the NAND Flash industry to continuously reduce the size of the cell transistors. Due to the limitations imposed by photolithography tools and the limits of shrinking the physical transistor size, schemes have been proposed whereby NAND cells are stacked in a direction perpendicular to the chip surface. Thereby, the effective chip area per data bit can be reduced without relying on the shrinkage of the physical cell transistor size. Generally speaking, there are two main types of stacked NAND flash memory device architectures. First, and as illustrated in simplified cross-sectional schematic form in FIG. 3, a vertically stacked array 30 may be fabricated with vertical channel NAND flash cell strings 32-35 formed over a substrate 31 to run in a direction that is perpendicular or orthogonal to the chip substrate 31. In the vertical channel NAND architecture, the memory cells 36 belonging to the same string are stacked vertically on top of each other, and different strings 32-35 are arranged as pillars that are laterally positioned next to one another. By convention, the device architecture for the vertically stacked array 30 may be referred to as Vertical Channel NAND or VC NAND. Second, and as illustrated in simplified cross-sectional schematic form in FIG. 4, a vertically stacked array 40 may be fabricated with vertical gate NAND flash cell strings 42-45 formed over a substrate 41 to run in a direction that is parallel to the chip substrate 41. In this architecture, memory cells 46 belonging to the same string (for example, 42) are aligned in a direction parallel to the chip surface as in conventional planar NAND cells, but additional strings (for example, 43-45) are stacked vertically on top of each other. By convention, the device architecture for the vertically stacked array 40 may be referred to as Vertical Gate NAND or VG NAND.

Figure 5:
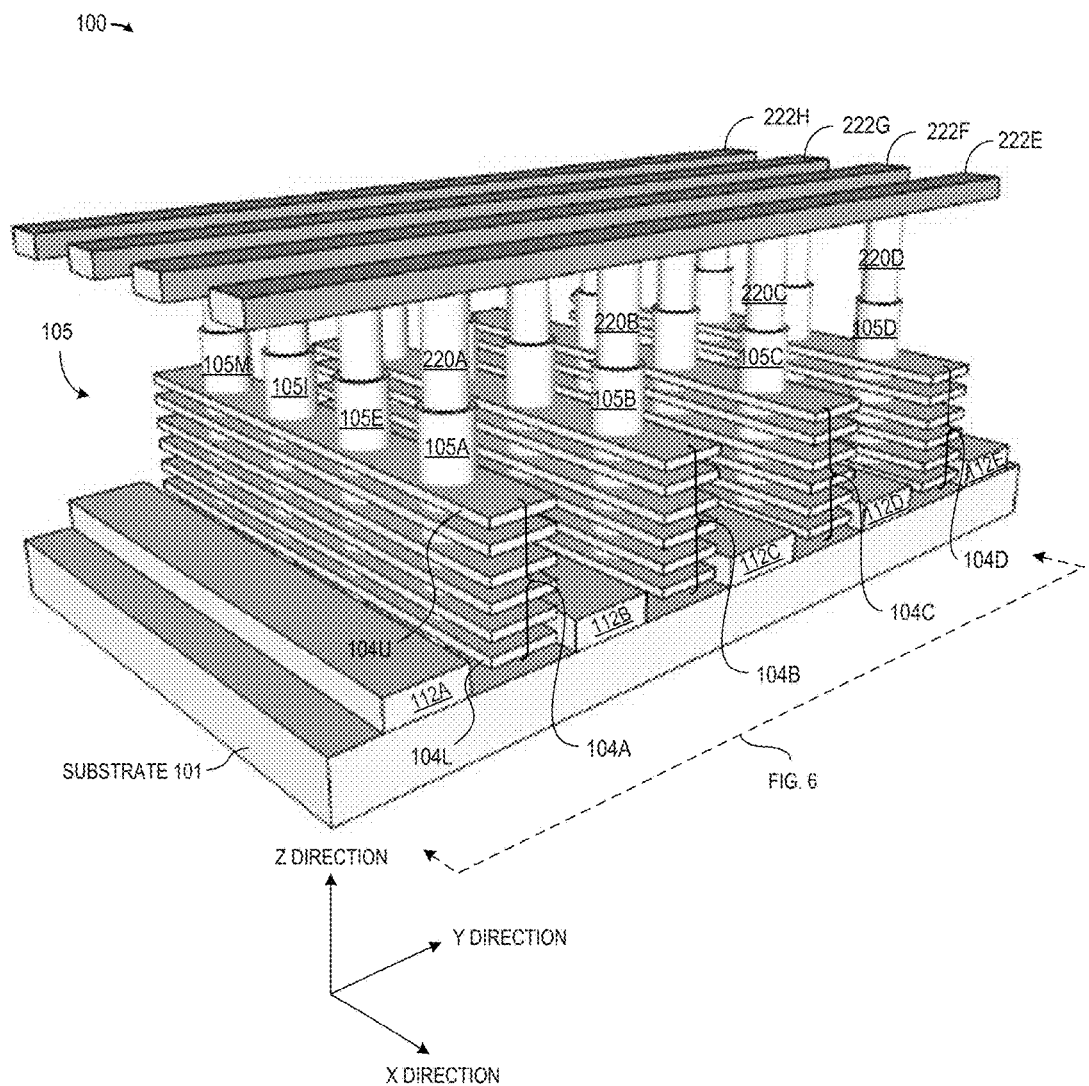
FIG. 5 illustrates a simplified perspective view of a three-dimensional vertical channel NAND flash memory array architecture using an access transistor having an elevated source region formed at a substrate base of each vertical channel NAND flash cell string.

FIG. 5 illustrates a simplified perspective view 100 of a three-dimensional vertical channel NAND flash memory array architecture having upper layer connection bit lines 222E-H formed over a plurality of vertical channel NAND flash cell strings 105 extending up from a substrate 101. As described more fully below, each string includes a pillar or cylinder shaped semiconductor body and surrounding multilayered memory film structures, with a plurality of stacked ground select, word line, and string select gate conductor lines 104 defining a vertical stack of transistors along each string. In the VC NAND flash memory 100, the plurality of NAND flash cell strings 105 are arranged in a matrix of rows and columns, with each NAND flash cell string 105 including an adjacent pair of elevated source structures or regions (e.g., 112A, 112B) in which a conductive source region is formed (e.g., by impurity implant, silicidation, etc.) which are connected across an extended channel region in the chip substrate 101 to the NAND flash cell string 105 which protrudes or extends vertically from the substrates 101 and through separate stacks of conductive word line or gate electrode layers (e.g., 104A) separated from one another by insulating layers (not shown) for direct connection to upper layer connection bit lines (e.g., 222E) via bit line contacts (e.g., 220A-D). As described hereinbelow, each NAND string may be formed with a cell body layer (for example, a cylindrical polysilicon layer 109 shown in FIG. 9) in which channels are formed to run in a vertical direction that is perpendicular to the chip surface, with different NAND strings being laterally separated from each other and arranged in a matrix shape when viewed from a top plan view. As formed, each NAND string includes a bottom vertical pillar portion, a plurality of middle memory cell pillar portions, and a top vertical pillar portion. In the bottom pillar portion, the cell body layer 109 is directly connected to the chip substrate 101, is shaped like a tube that wraps around a non-conductive dielectric core 110, and may be surrounded by a multilayered memory film structure 107. In addition, the bottom pillar portion is connected across the substrate 101 to the elevated source regions (e.g., 112A, 112B) which protrude from the chip substrate 101. On the opposite end of each NAND string, the top vertical pillar portion is directly connected across a bit line contact (e.g., 220A) to an upper layer connection bit line (e.g., 222E).

Figure 9:
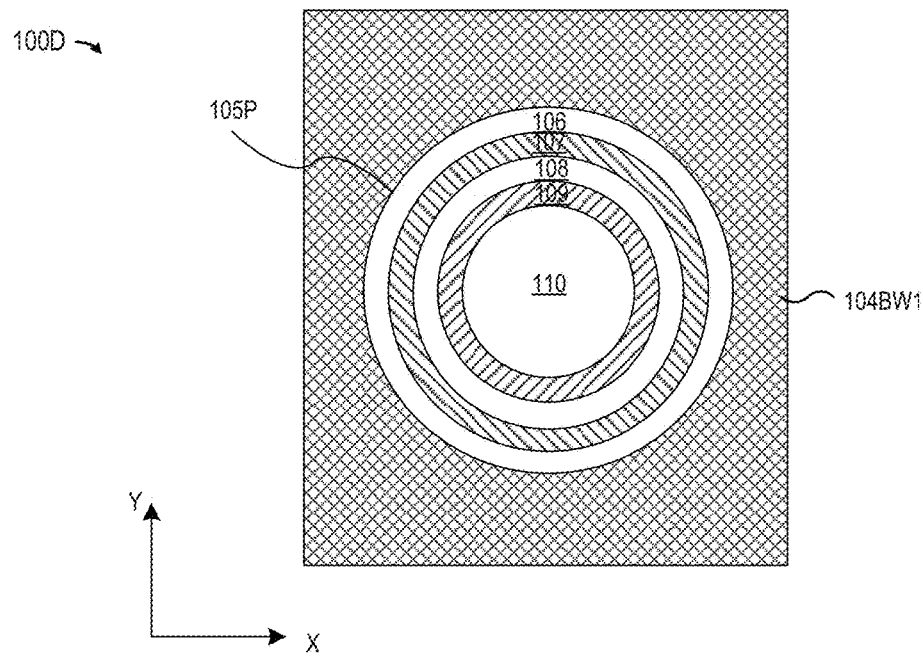
FIG. 9 illustrates a plan view of a selected transistor gate from FIG. 8 to show additional structural details of the flash cell strings in the vertical channel NAND flash memory structure shown in FIG. 6.

In the illustrated example, the cell transistors in each silicon flash cell string (for example, 105A) are formed as gate-all-around devices by forming stacked word line gate structures (e.g., 104A) along each NAND flash string row (e.g., 105A, 105E, 105I, 105M) to surround the silicon flash cell string with cell transistor gates where each cell channel is formed. As shown in FIG. 9, each string 105 may include a multi-layered memory film structure 107 formed around a cell body layer 109, where the memory film structure 107 may include a tunnel dielectric layer formed to surround the channel region of the cell body layer 109, a charge storage layer (for example, silicon nitride) formed around the tunnel dielectric layer, and a coupling dielectric formed around the charge storage layer. Around each string (e.g., 105A), a stack of word line gate structures (e.g., 104A) may be formed with one or more patterned polysilicon layers to extend across multiple strings (e.g., 105A, 105E, 105I, 105M). While the transistors formed in each silicon string may include implanted and/or diffused source/drain regions (for example, n+ regions) for each defined transistor cell, in other embodiments, the transistors formed in at least the middle memory cell pillar portions may be formed as junction-free cells with virtual source/drain regions formed to have conductivity that depends on the existence of electric fringe fields between gates adjacent to the source/drain regions and the source/drain silicon itself.

In addition to the stacked word line gate structures defining multiple memory cells, each string may also include additional gate structures on each end of the string to define ground and string select line transistors. For example, ground select line transistors may be formed with a lower select gate at the bottom of each string with separate conductive gate structures (e.g., gate conductors made with patterned polysilicon or other conductive materials) (e.g., 104L) which connect the source node of each vertical flash cell string (e.g., 105A) across an extended channel region formed in the substrate 101 to an adjacent pair of elevated source regions (e.g., 112A, 112B) protruding from the substrate 101. In addition, string select transistors may be formed as an upper select gate at the top of each vertical flash cell string (e.g., 105A) with separate conductive gate structures (e.g., 104L) which connect the drain nodes of each vertical flash cell string 105A) across a bit line contact (e.g., 220A) to a corresponding bit line (e.g., 222E) of the cell array under control of a string select signal. In this way, the source nodes of all strings in a designated block are connected across an extended channel region formed in the substrate 101 and to the elevated source regions 112, thereby physically lengthening the channel of the lower ground select line transistors, but the drain node of each string (e.g., 105A) is shared only horizontally with other strings in a first lateral or bit line direction (e.g., 105B-D) via a shared bit line (e.g., 222E), but not with strings in a second lateral or word line direction. If desired, the ground and string select transistors my be formed as gate-all-around devices substantially as described above. For example, the string select transistor at the drain node of each string (e.g., 105A) may be formed with a conductive gate structure (for example, 104U) formed around a multi-layered memory film structure, while the ground select transistor at the source node of each string (e.g., 105A) may be formed with a conductive gate structure (e.g., 104L) formed around the corresponding multi-layered memory film structure.

As depicted in FIG. 5, the vertical channel NAND flash memory array 100 includes NAND flash strings 105 which run in the z-direction, where each string includes string select transistors formed with string select gates/lines (e.g., 104L), cell transistors formed with cell control gates (e.g., 104A), and ground select transistors formed with ground select gates (e.g., 104U). In each NAND flash string, the transistors are serially connected with the string select transistor located at the top, the cell transistors in the middle, and the ground select transistor at the bottom of the string. As described more fully hereinbelow, each string select transistor includes a drain region which is electrically connected across a bit line contact (e.g., 220A) to an upper layer connection bit line (e.g., 222E) of the cell array, and a source which is connected to one of the multiple series-connected cell transistors in the associated NAND flash string. In addition, each ground select transistor includes an extended channel region that extends from the bottom of the string and across the substrate 101 to the adjacent elevated source regions (e.g., 112A, 112B), a source formed in the elevated source regions 112, and a drain which is connected to one of the multiple series-connected cell transistors in the associated NAND flash string. String select transistors, cell transistors, and ground select transistors have gates connected to string, word, and ground select lines (e.g., 104A) each running in the x-direction.

As described hereinbelow, each NAND flash string 105 is formed with a semiconductor body (e.g., 109) which is shared by the string, cell, and ground select transistors belonging to that string. In selected embodiments, each NAND flash string has a shape which resembles a cylinder or vertical pillar on that the string body or channel 109 runs along the long axis of the cylinder in the z-direction. In selected embodiments, such strings can be fabricated within vertical, cylinder-shaped memory holes which are etched through stacked alternating layers of conductive gate material 104 and interlayer dielectrics, such as by sequentially forming layers inside the memory hole, including a multi-layered memory film structure 106-108, semiconducting string body thin film 109 (e.g., polysilicon), and dielectric filler material 110 (e.g., silicon oxide). In selected embodiments, the memory film structure may be formed with an outermost blocking (or coupling) dielectric 106, an inner charge storage layer 107, and an innermost tunnel dielectric 108. In addition, the string select transistors and ground select transistors may have the same basic structure as the cell transistors, though a gate dielectric layer may replace the memory film structure 104 in the case of the string select transistor and/or ground select transistor since these transistors do not store any data.

When a transistor in a string 105 is turned on, a conductive channel of a first conductivity type (for example n-type) is formed in the transistor body 109. When all transistors of a string are turned on during a read or program operation, a continuous conductive channel of the first conductivity type forms throughout the entire string 105 from the string drain to the string source, thereby forming a conductive path from a bit line to a source line node. During an erase operation, the string body 109 is charged with a high positive voltage (e.g., 18V-20V), thereby inducing a second, opposite conductivity type (for example p-type). To control the different read, program, and erase modes, each cell string has four different kinds of terminals to which external voltages can be applied: a drain terminal (bit line node), a source terminal (source line node), a body terminal (body line), and multiple gate terminals which are the gate terminals of string select transistors, cell transistors and ground select transistors.

The depicted vertical channel NAND flash memory 100 illustrates selected example embodiments of a three-dimensional vertical channel NAND flash memory array, but it will be appreciated that a vertical channel NAND flash memory may be implemented with different features and structures. For example, the cell string structures are described has having a dielectric filler at the core of the vertical pillar structures, but such structures are not functionally required in all embodiments. In addition, the different semiconductor structures, such as the flash strings or transistor gates, may be formed with polysilicon or with any desired semiconductor material. There are also numerous variations in the charge storage structures used to store charge in NAND flash devices, such as, for example, floating gate devices, charge-trap devices, etc. And while the string bodies may be formed with implanted p-type semiconductor material, selected embodiments may form the string bodies with undoped or even lightly n-type doped semiconductor material, such as silicon. Even in these cases, the conductivity type may be controlled during read/program or erase operation by way of external biasing conditions. It will also be appreciated that the vertical channel NAND flash memory 100 shown in FIG. 5 shows conductive elements, such as interconnections, contacts, string bodies and gate material, to highlight the connectivity of the constituting elements, but does not show isolating materials, such as gate dielectrics, interlayer dielectrics, inter-metal dielectrics, etc. Persons skilled in the art will understand that dielectric layers are located around the conductor elements to provide electrical isolation.

Figure 6:
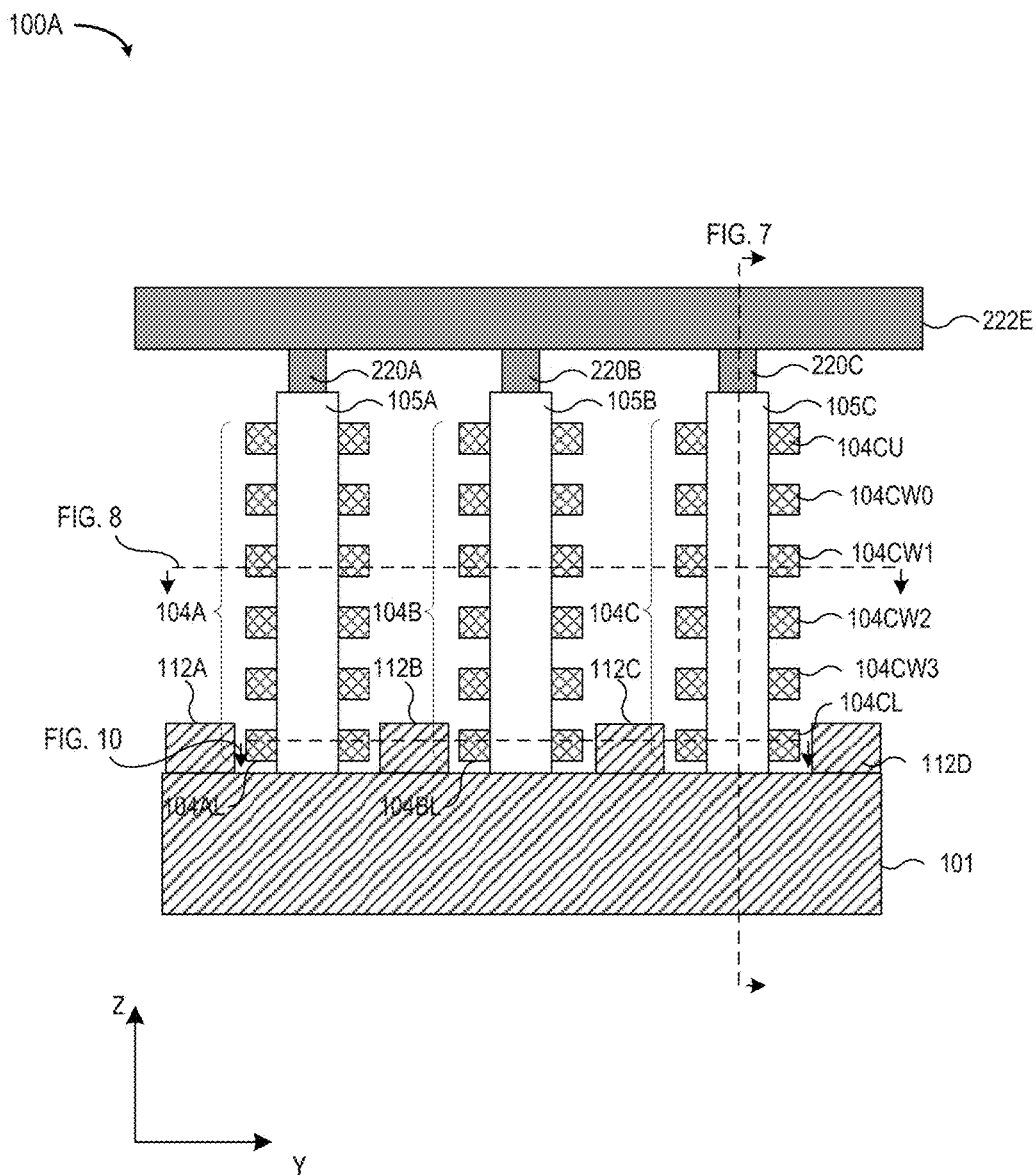
FIG. 6 illustrates a partial cross-sectional view of the vertical channel NAND flash memory structure shown in FIG. 5 cut in a bit line direction through an upper layer connection bit line.

Turning now to FIGS. 6-12, there are provided various plan and cross-sectional views of the cell structures in the vertical channel NAND flash memory array 100 shown in FIG. 5 which reference x, y, and z axis directions. In these figures, a direction along an x-axis refers to a direction parallel to the word lines 104, a direction along a y-axis refers to a direction parallel to bit lines 222, and a direction along a z-axis refers to a direction perpendicular to the surface of the chip substrate 101. For example, FIG. 6 illustrates a vertical cross-sectional view 100A of the vertical channel NAND flash memory structure shown in FIG. 5 cut in a bit line direction through an upper layer connection line 222A. In addition, FIG. 6 shows various cutting lines for FIGS. 7-8 and 10 which will be shown as individual figures subsequently. As shown in the vertical cross-sectional view 100A, a row of NAND flash strings 105A-C extend from the substrate 101, through the stacked cell and select gate structures 104A-C, and across bit line contacts 220A-C to the upper layer connection bit line 222E. In selected embodiments, the substrate 101 may be formed as a p-type well formed in an n-type semiconductor substrate (e.g., a monocrystalline silicon substrate). Over the substrate 101, each NAND flash string (e.g., 105C)—which includes a string body or channel surrounded by a gate dielectric layer, memory film structure, and outermost blocking/coupling dielectric layer—extends through stacked gate structures, including a lower select gate (e.g., 104CL), memory cell gates (e.g., 104CW0-W4), and upper select gate (e.g., 104CU). As illustrated, selected NAND flash strings in a column (e.g., 105A-C) are connected across interconnect or via structures (e.g., 220A-C) to a shared upper layer connection bit line 222A which runs in the y-direction.

In the depicted configuration 100A, each NAND flash string (e.g., 105C) includes a vertical stack of storage cells with cell transistor gate electrodes (e.g., 104CW0-W1) which wrap around the vertical string bodies as gate-all-around type gates, and which are shaped as elongated lines in the x-direction to form word lines. In addition, each NAND flash string (e.g., 105C) includes upper and lower select transistors formed on opposed ends of the storage cells with upper and lower transistor gate electrodes (104CU, 104CL) which wrap around the vertical string bodies as gate-all-around type gates, and which are shaped as elongated lines in the x-direction to form upper select lines (or string select lines) and lower select lines (or ground select lines), respectively. The upper transistor gate electrodes 104CU are also referred to as upper select gates (USG), string select gates, string select lines (SSL), string select transistors (SST), while the lower transistor gate electrodes 104CL are also referred to as lower select gates (LSG), ground select gates, ground select lines (GSL), ground select transistors (GST). The transistor gate electrodes 104 may be made of metal material (e.g., titanium nitride), polysilicon, silicided polysilicon, or other suitable conductive gate electrode materials.

To improve the design and performance of the lower select transistor in each NAND flash string 105, elevated source regions (e.g., 112C-D) are formed in direct electrical or physical contact with the substrate 101 using a suitable semiconductor material so as to be positioned adjacent to, but insulated from, each lower select gate electrode (e.g., 104CL). In selected embodiments, the elevated source regions 112 may be formed to protrude from the substrate 101 using an epitaxial semiconductor growth process to fill an etched opening or hole which exposes the substrate 101 without also exposing the lower select gate electrodes 104L or any other gate electrodes which may be protected by an insulating layer or material. In such embodiments, the elevated source regions 112 may be formed with monocrystalline semiconductor (e.g., monosilicon, single crystal silicon germanium, or the like) which is selectively epitaxially grown on the substrate 101. In other embodiments, the elevated source regions 112 may be deposited layers of polycrystalline semiconductor (e.g., polysilicon or the like). In order to enhance the conductivity, selected portions of the elevated source regions 112 may be doped or implanted with conductivity-enhancing impurities. For example, n-type impurities may be implanted into an upper surface region of the elevated source regions 112 in the case where the substrate 101 is doped with p-type impurities. In order to further enhance the conductivity of the elevated source regions 112, a silicide layer may be formed on an upper surface of the elevated source regions 112, such as by using a silicide process which employs refractory metals such as tungsten, titanium or non-refractory metals such as cobalt, platinum, nickel etc.

Figure 7:
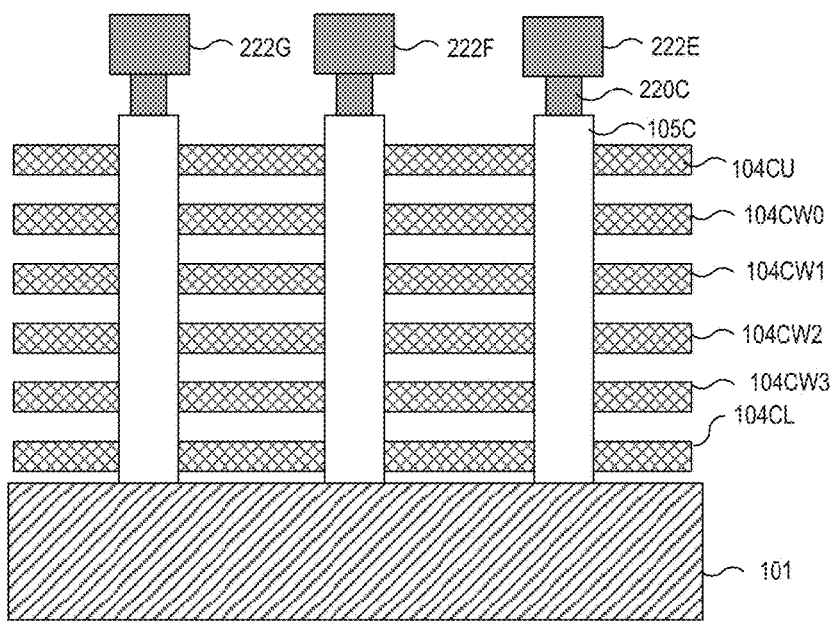
FIG. 7 illustrates a partial cross-sectional view of the vertical channel NAND flash memory structure shown in FIG. 6 cut in a word line direction through a row of flash cell strings.

To illustrate additional structural details of the vertical channel NAND flash memory shown in FIG. 6, reference is now made to FIG. 7 which illustrates a vertical cross-sectional view 100B taken in a word line direction through a row of NAND flash strings indicated with the "FIG. 7" view line shown in FIG. 6. As illustrated, a row of NAND flash strings 105K, 105O, 105C are aligned in the x-axis direction and extend from the substrate 101, through the stacked cell and select gate structures 104CL, 104CW0-W3, and 104CU, and to the upper layer connection bit lines 2220, 222F, 222E. The gate electrode structures 104CL, 104CW0-W3, and 104CU are in fact elongated word lines, upper select lines and lower select lines which extend in the x-direction to couple corresponding transistor gates from each row of NAND flash strings which share an adjacent set of elevated source line regions (e.g., 112C, 112D) while being connected to different bit lines 222. In particular, each NAND flash string in the row (e.g., 105C) extends from the substrate 101 and through the vertical stacked lower select gate structure 104CL, cell gate structures 104CW0-W3, and upper select gate structure 14CU. However, the upper portion of the string 105C is connected across a via bit line contacts (e.g., 220C) to the upper layer connection bit lines (e.g., 222E), while the other NAND flash strings in the row are connected to different upper layer connection bit lines.

Figure 8:
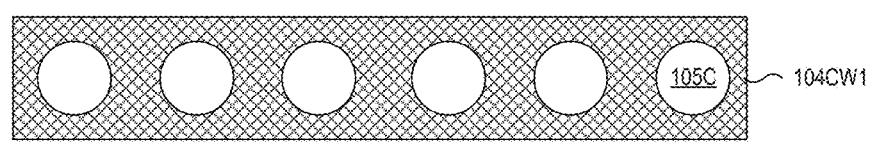
FIG. 8 illustrates a plan view of upper layer transistor gate or word lines in a single lateral plane in the vertical channel NAND flash memory structure shown in FIG. 6.
Figure 8:
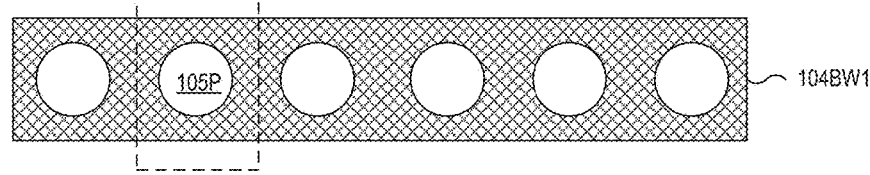
Figure 8:
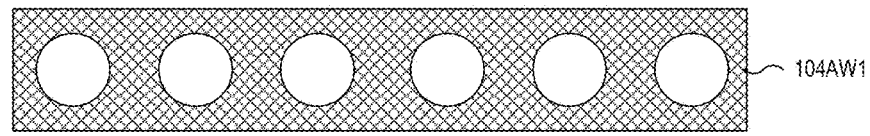
Figure 8:
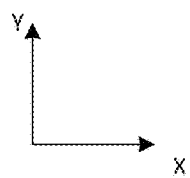

To illustrate additional structural details of the vertical channel NAND flash memory shown in FIG. 6, reference is now made to FIG. 8 which illustrates a topographical plan view 100C taken in the x-y plane through an upper layer of transistor gate word lines 104AW1, 104BW1, 104CW1 indicated with the "FIG. 8" view line shown in FIG. 6. As illustrated, each word line may be formed with a patterned layer of conductive material, such as doped polysilicon, which is shared by a plurality of NAND flash strings, though the detailed structure of the string bodies 105 with gate insulating layers and charge storage layers is not shown. In particular, a first transistor gate word line 104CW1 extends horizontally in the x-direction to surround a first row of NAND flash strings which includes string 105C, thereby forming a gate-all-around type gate electrode. In the same layer, a second, separate transistor gate word line 104BW1 extends horizontally in the x-direction in surround a second row of NAND flash strings which includes string 105P. In addition, a third transistor gate word line 104AW1 extends horizontally across another row of NAND flash string structures. As will be appreciated, the same layout and arrangement of transistor gate word lines shown in FIG. 8 could be used for other levels in the stacked array, including other transistor gate word lines, ground select transistor lines, and/or string select transistor lines. Though the transistor gate word lines are shown as being shared by a single row of NAND flash strings, it will be appreciated that a single word line may be shared by one or more rows of NAND flash strings structures.

To illustrate additional structural details of the vertical channel NAND flash memory shown in FIG. 6, reference is now made to FIG. 9 which illustrates a detailed plan view 100D of the NAND flash string 105P taken in the x-y plane as indicated with the "FIG. 9" view line shown in FIG. 8. The depicted x-y plan view of the intersection of the gate electrode 104BW1 and NAND flash string 105P is a location where a storage cell transistor is located, though the same structural details could be used for other transistors at other levels in the stacked array, including other transistor gate word lines, ground select transistor lines, and/or string select transistor lines. As illustrated, the word line or gate electrode 104BW1 may be formed with a patterned layer of conductive material in which a pillar or string hole opening is formed, such as by etching, to expose the underlying substrate 101. In the pillar/string hole, the NAND flash string is formed by sequentially forming or depositing an outermost blocking (or coupling) dielectric 106, an inner charge storage layer 107, and an innermost tunnel dielectric 108, a semiconducting string body thin film 109 (e.g., polysilicon), and dielectric filler material 110 silicon oxide). In selected embodiments, the blocking dielectric 106 may be formed with a conformal layer of high-k dielectric material, such as aluminum oxide, thereby leaving a central opening. In the central opening, the charge storage layer 107 may be formed by depositing one or more silicon nitride charge trapping layers on the inner face of the central opening. In other embodiments, the charge storage layer 107 may be formed with a semiconductor material, such as polysilicon. In addition, the tunnel dielectric layer 108 may be formed by depositing a conformal layer of silicon oxide on the charge storage layer 107. On the tunnel dielectric layer 108, a thin film or layer of semiconductor material (e.g., polysilicon) may be conformally deposited to form a cylindrical shaped string body 109 which may then be filled with a dielectric filler 110 of silicon oxide, though the space inside the cylindrical shaped string body 109 may be completely filled with the semiconductor material used to form the string body 109.

Figure 10:
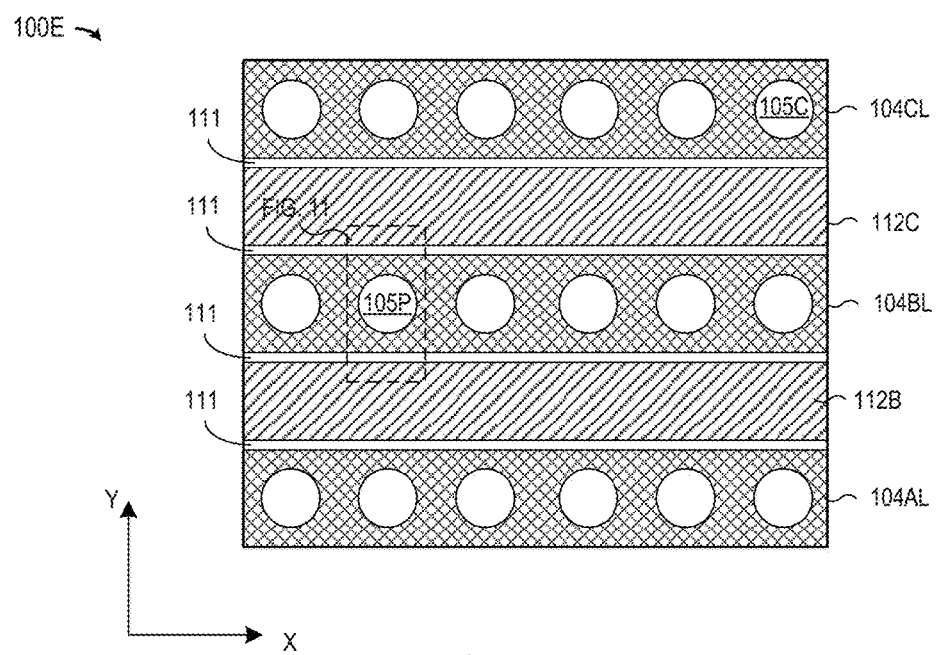
FIG. 10 illustrates a plan view of lower layer access transistor gate lines with adjacent elevated source regions in a single lateral plane in the vertical channel NAND flash memory structure shown in FIG. 6.

To illustrate additional structural details of the vertical channel NAND flash memory shown in FIG. 6, reference is now made to FIG. 10 which illustrates a topographical plan view 100E taken in the x-y plane through lower layer access transistor gate lines 104AL, 104BL, 104CL and adjacent elevated source regions 112B-C in a single lateral plane indicated with the "FIG. 10" view line shown in FIG. 6. As illustrated, each word line 104AL, 104BL, 104CL may be formed with a patterned layer of conductive material, such as doped polysilicon, which is shared by a plurality of NAND flash strings, though the detailed structure of the string bodies 105 with gate insulating layers and charge storage layers is not shown. In particular, a first lower layer access transistor gate line 104CL extends horizontally in the x-direction to surround a first row of NAND flash strings which includes string 105C, thereby forming a gate-all-around type lower select gate electrode. In the same layer, a second, separate lower layer access transistor gate line 104BL extends horizontally in the x-direction to surround a second row of NAND flash strings which includes string 105P. In addition, a third lower layer access transistor gate line 104AL extends horizontally across another row of NAND flash string structures. In between each lower layer access transistor gate word line, elevated source regions 112B-C are formed to extend horizontally in the x-direction to be parallel with the lower layer access transistor gate lines 104AL, 104BL, 104CL, but separate therefrom by an insulating or gap fill dielectric layer 111.

Figure 11:
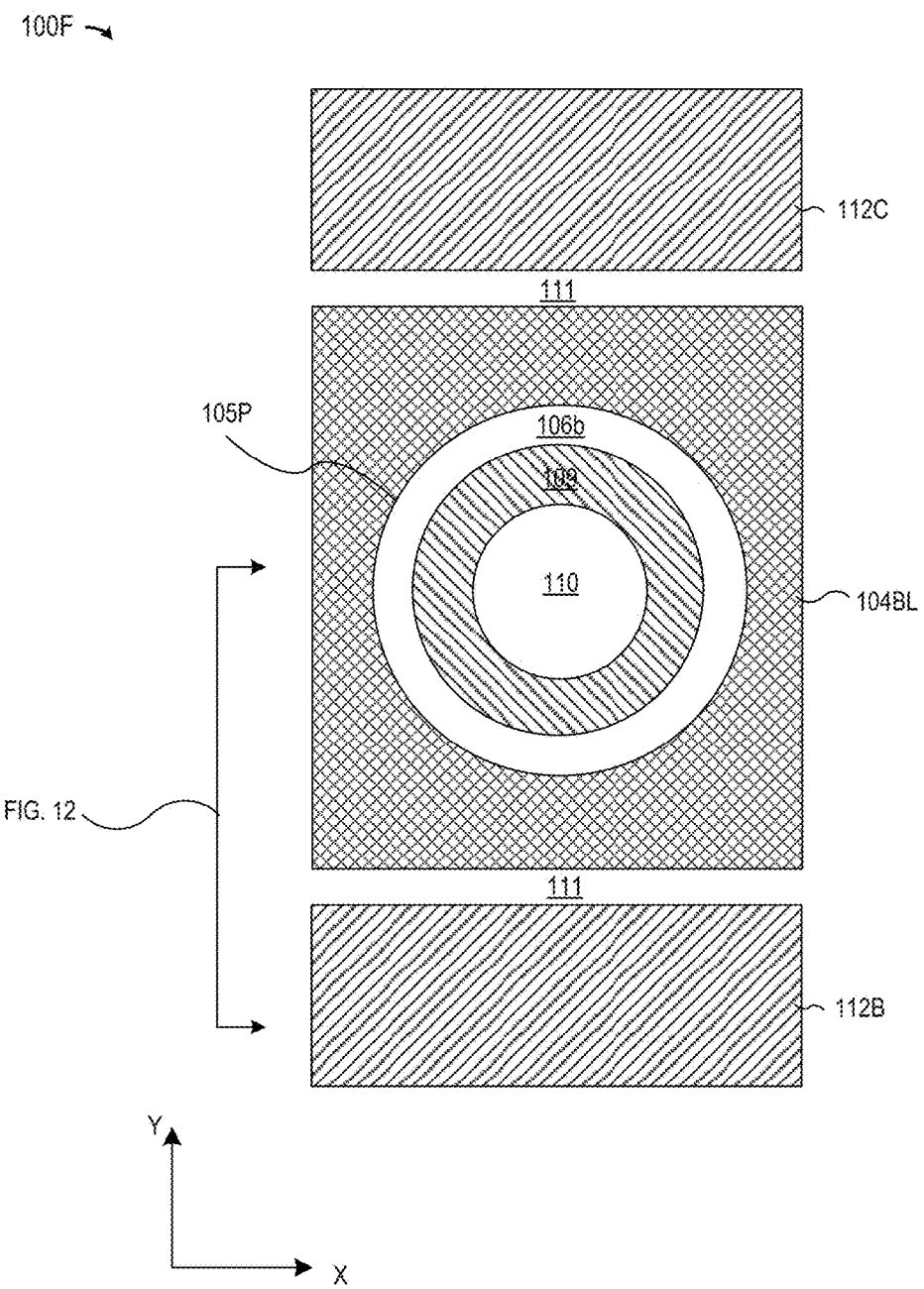
FIG. 11 illustrates a plan view of a selected access transistor gate from FIG. 10 to show additional structural details of the flash cell strings in the vertical channel NAND flash memory structure shown in FIG. 6.

To illustrate additional structural details of the vertical channel NAND flash memory shown in FIG. 6, reference is now made to FIG. 11 which illustrates a detailed plan view 100F of the NAND flash string 105P taken in the x-y plane as indicated with the "FIG. 11" view line shown in FIG. 10. The depicted x-y plan view of the intersection of the gate electrode 104BW1 and NAND flash string 105P is a location where a select or access transistor is located, though the same structural details could be used for other lower layer select or access transistors in the stacked array. As illustrated, the word line or gate electrode 104BW1 may be formed with a patterned layer of conductive material in which a pillar or string hole opening is formed, such as by etching, to expose the underlying substrate 101. In the pillar/string hole, the NAND flash string 105P is formed by sequentially forming or depositing an outermost blocking (or coupling) dielectric 106b, a semiconducting string body thin film 109 (e.g., polysilicon), and dielectric filler material 110 (e.g., silicon oxide). In selected embodiments, the blocking dielectric 106b may be formed with a conformal layer of high-k dielectric material, such as aluminum oxide, thereby leaving a central opening. In the central opening, a thin film or layer of semiconductor material (e.g., polysilicon) may be conformally deposited to form a cylindrical shaped string body 109 which may then be filled with a dielectric filler 110 of silicon oxide, though the space inside the cylindrical shaped string body 109 may be completely filled with the semiconductor material used to form the string body 109. In yet other embodiments, the cylindrical shaped string body 109 may be completely filled with a semiconductor material only for the lower select gate, whereas the string body for cell transistors may include a dielectric filler 110 of silicon oxide. This is possible because the lower select transistor is not used for data storage and does not need the precise control of threshold voltage that is needed for the cell transistors. As shown in FIG. 11, the lower layer select or access transistors may optionally not include a charge storage layers positioned between the string body 109 and word line or gate electrode 104BW1, though in selected embodiments, the detailed structure of a lower select gate transistors may be identical to the structure for the storage cell transistors such as shown in FIG. 9.

Figure 12:
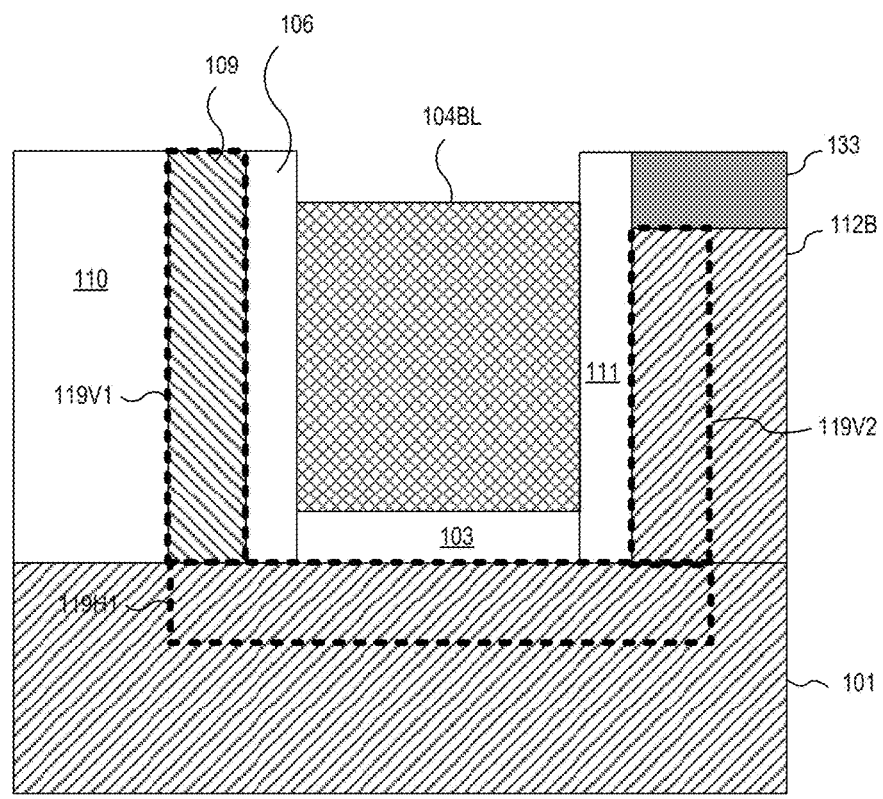
FIG. 12 illustrates a partial cross-sectional view of one side of the selected access transistor gate from FIG. 11 to show additional structural details of the flash cell strings in the vertical channel NAND flash memory structure shown in FIG. 6.

To give a clearer understanding of the three-dimensional shape of the vertical channel NAND flash memory structure, reference is now made to FIG. 12 which shows an enlarged partial cross-sectional view 100G of one side of the select or access transistor gate from FIG. 11 taken in the y-z plane as indicated with the "FIG. 12" view line shown in FIG. 11. As illustrated, the lower portion of the cylindrical shaped string body 109 is formed in direct electrical or physical contact with the substrate 101 using a suitable semiconductor material, such as polysilicon or epitaxial monocrystalline silicon, so as to be positioned adjacent to, but insulated from, the lower select gate electrode (e.g., 104BL) by the outermost blocking (or coupling) dielectric 106. Formed as a wrap-around gate electrode, the lower layer access transistor gate line 104BL is insulated from the substrate 101 by an insulating dielectric layer 103 which may be formed on the substrate in the course of fabricating the stack of conductive word line or gate electrode layers and insulating layers. In addition, the lower layer access transistor gate line 104BL is insulated from the subsequently formed elevated source regions (e.g., 112B) by a sidewall insulating dielectric layer 111 which is formed in on the sidewall(s) of the elongated trench or opening used to define and separate the lower layer access transistor gate lines 104AL, 104BL, 104CL. In particular, after etching an elongated trench or opening through the stack of conductive word line or gate electrode layers and insulating layers to expose the substrate 101, a conformal dielectric layer 111 may be deposited on the sidewall and bottom surfaces of the trench/opening, followed by application of an anisotropic etch process to remove the conformal dielectric layer 111 from the bottom surface of the trench/opening, thereby exposing the substrate 101 for use in epitaxially growing the elevated source region 112B.

With this construction, the wrap-around gate electrode 104BL is surrounded in a U-shaped dielectric film layer 103, 106, 111 so that the semiconductor regions 109, 101, 112B wrap around the gate 104BL to form a U-shaped channel region. As a result, the bottom transistor on each NAND flash string includes a first vertical semiconductor channel portion 119V1 (e.g., cylindrical shaped string body 109) and a second vertical semiconductor channel portion 119V2 (e.g., elevated source regions 112B) connected together across a third horizontal substrate channel portion 119H1 (e.g., substrate 101). The first vertical semiconductor channel portion of each string 105 may be shaped as a hollow (or optionally filled) cylindrical semiconductor tube 109 that is directly electrically connected between the substrate 101 and the uppermost vertical portion adjacent to the upper or string select gate which is controlled by the sidewall-facing portion of the corresponding string select transistor (e.g., 104CU). The second vertical semiconductor channel portion of each string 105 may be formed in the elevated source regions 112 protruding up from the substrate 101 to be located adjacent to the lower layer access transistor gate line 104. Formed as part of the substrate 101, the third horizontal substrate channel portion of each string 105 directly connects the first and second vertical semiconductor channel portions 109, 112 to function as a semiconductor body region which is insulated from the lower layer access transistor gate line 104 by insulating dielectric layers 103, 106, 111 having a substantially uniform thickness.

In selected embodiments, a topmost portion 133 of the elevated source region 112 may be implanted with a high impurity concentration (typically n-type) to form a conductive source of the lower select or access gate transistor, while the remaining portion of the elevated source region 112B has the same conductivity type as the vertical channel region 109 and the horizontal channel region in the substrate 101. The conductivity type and concentrations for the semiconductor regions 109, 101, 112B and topmost portion 133 of the elevated source region 112 may be controlled by using patterning mask and implantation techniques to selectively implant ions of the desired conductivity type and amount into the target regions. The formation of the conductive source region 133 may be controlled to provide a predetermined overlap with the top surface of the lower layer access transistor gate line (e.g., 104BL), thereby promoting formation of conductive channels in the access transistor under control of the transistor gate line while simultaneously reducing short channel effects and associated leakage currents from the flash NAND string by providing a physically lengthened transistor channel across the semiconductor regions 109, 101, 112B. While only a portion of the elevated source regions 112 may be doped to form a conductive source, in other embodiments, the entirety of the elevated source regions 112 may be doped with a high impurity concentration, shielded, or otherwise rendered conductive, thereby forming an extended channel region for the lower select or access gate transistor which includes the vertical channel region 109 and the horizontal channel region in the substrate 101.

While any desired fabrication sequence may be used to form the vertical channel NAND flash memory structures disclosed herein, the manufacturing process may include an initial step of forming a NAND flash memory cell array in which transistors are vertically stacked on NAND flash strings arranged in a matrix pattern to extend up from a substrate. For example, alternating layers of polysilicon and dielectric insulator layers may be deposited to define a laminated stack of gate conductor layers over a substrate. In other embodiments, the laminated stack of gate conductor layers may be formed by forming alternating layers of two different dielectric insulator materials (e.g., silicon oxide and silicon nitride) in a stack, removing one of the insulating material layers (e.g., selectively etching the silicon nitride layer) for replacement with a metal gate material (e.g., titanium nitride). In the laminated stack, a matrix pattern of memory holes may be selectively etched down to the substrate, and then sequentially filled with memory film structure layers and semiconductor body layers to thereby form the vertical channel NAND flash strings. Before or after forming the vertical channel strings, the laminated stack may be patterned and selectively etched to form an array of substrate openings down to the substrate to define patterned gate conductor layers, followed by selective formation of insulating dielectric layers on the sidewalls but not bottom surfaces of the substrate openings. With the bottom surfaces exposing the substrate, elevated source regions may be selectively epitaxially grown from the exposed bottom surface of the substrate openings to a suitable height for overlap with the lower select or access gate transistor on each NAND flash string. Over the VC NAND flash strings, a plurality of upper connection bit lines may then be formed with metal contacts which are positioned and connected to underlying vertical string structures. Subsequently, additional interconnect structures are formed to connect to the upper connection bit line conductors.

Figure 13:
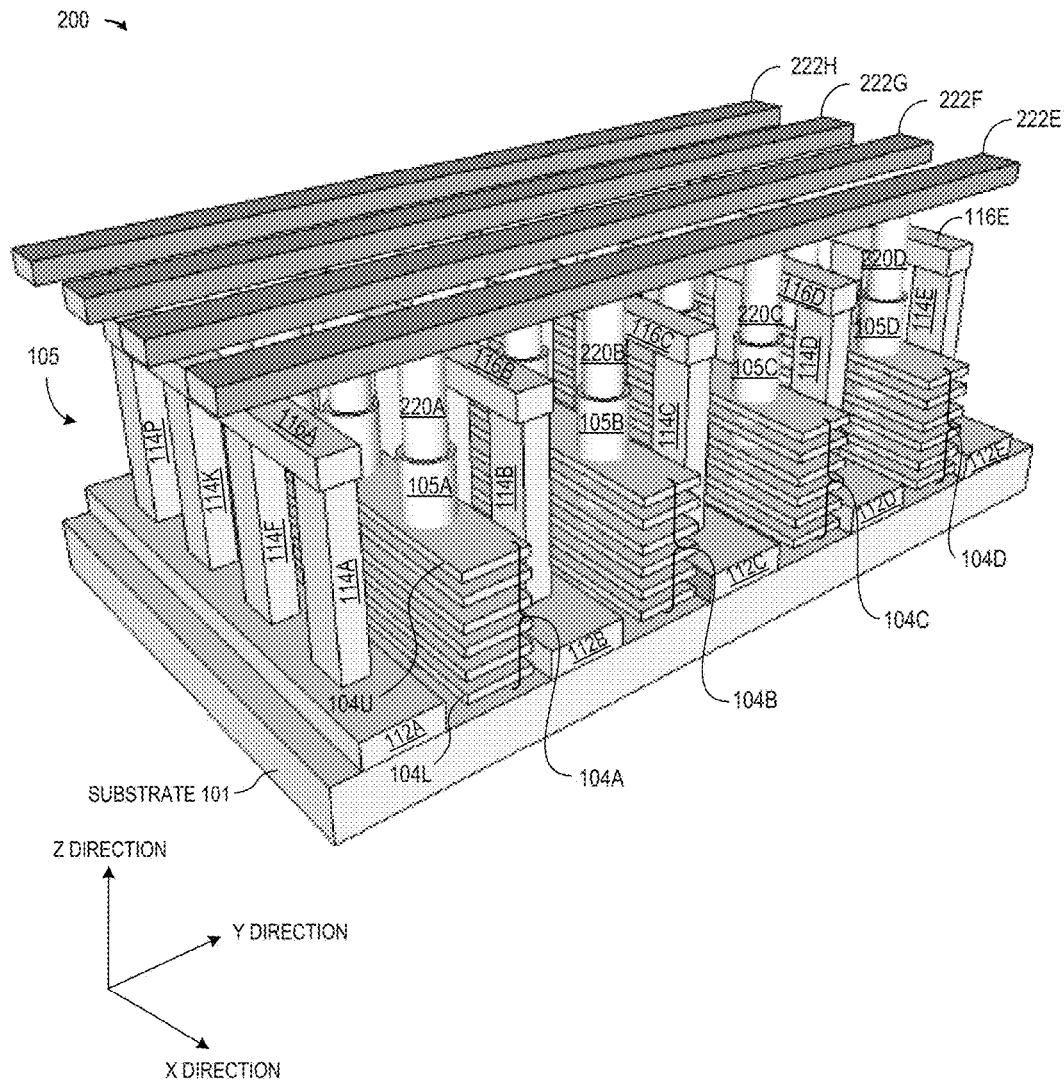
FIG. 13 illustrates a simplified perspective view of a three-dimensional vertical channel NAND flash memory array architecture in accordance with selected embodiments of the present disclosure wherein separate source contacts are formed along each word line direction to connect each elevated source region to a shared source line metal interconnect layer.

In accordance with selected embodiments, electrical resistance associated with accessing the elevated source regions 112 may be reduced by providing low resistance interconnects through the NAND flash memory cell array. For example, reference is now made to FIG. 13 which illustrates a simplified perspective view 200 of a three-dimensional vertical channel NAND flash memory array architecture having upper layer connection bit lines 222E-H formed over a plurality of vertical channel NAND flash cell strings 105 extending up from a substrate 101 wherein separate source contacts 114 are formed along each word line direction to connect each elevated source region 112 to a shared source line metal interconnect layer 116. As shown in FIG. 13, the vertical channel NAND flash memory array architecture generally shares the same structure as the VC NAND flash memory array architecture shown in FIG. 5 so that an array of NAND flash cell strings 105 is arranged in a matrix of rows and columns to extend from the chip substrate 101 and through a plurality of stacked word line conductors 104A-C to define a vertical stack of transistors along each string, each including a pillar or cylinder shaped semiconductor body and surrounding multilayered memory film structures. In addition, each row of NAND flash cell strings 105 includes an adjacent pair of elevated source regions (e.g., 112A-D) which are connected across a channel region in the chip substrate 101 to the row of NAND flash cell strings 105 which protrude or extend vertically from the substrate 101 and through separate stacks of conductive word line or gate electrode layers (e.g., 104A) separated from one another by insulating layers (not shown) for direct connection to upper layer connection bit lines (e.g., 222E) via bit line contacts (e.g., 220A-D). As a result, each cell string includes a top vertical pillar portion, a plurality of middle memory cell pillar portions, and a bottom vertical pillar portion which is directly connected across the chip substrate 101 to the elevated source regions (e.g., 112A, 112B) which protrude from the chip substrate 101.

To provide electrical contact to the source node of each string 105, FIG. 13 shows that separate source contacts 114 may be formed to make direct electrical or physical contact with the elevated source regions 112. In selected example embodiments, separate source contacts (e.g., 114A, 114F, 114K, 114P) may be formed after fabrication of the elevated source regions (e.g., 112A) by covering the elevated source regions 112 with one or more deposited dielectric fill layers which are then patterned and etched to form a plurality of source contact openings that expose the elevated source region (e.g., 112A). Subsequently, the source contact openings may be filled with one or more conductor layers to define the plurality of source contacts (e.g., 114A, 114F, 114K, 114P) which extend along each word line direction and which are laterally spaced apart from the vertical flash cell strings. To connect the source contacts (e.g., 114A, 114F, 114K, 114P) in each row, a shared metal interconnect source line (e.g., 116A) may be formed with one or more patterned or damascene conductor layers which extend along each word line direction to connect the source contacts extending from an elevated source region (e.g., 112A). By providing metal source contacts 114 and shared metal interconnect source lines 116 for connection to the elevated source regions 112 of each row of NAND flash cell strings, the resistance of the source lines may be reduced. As will be appreciated, the formation of separate source contacts 114 allows direct electrical connection to the elevated source regions 112, whether formed as line-shaped regions running in the x-direction or as island-shaped regions in the x-direction (not shown).

Figure 14:
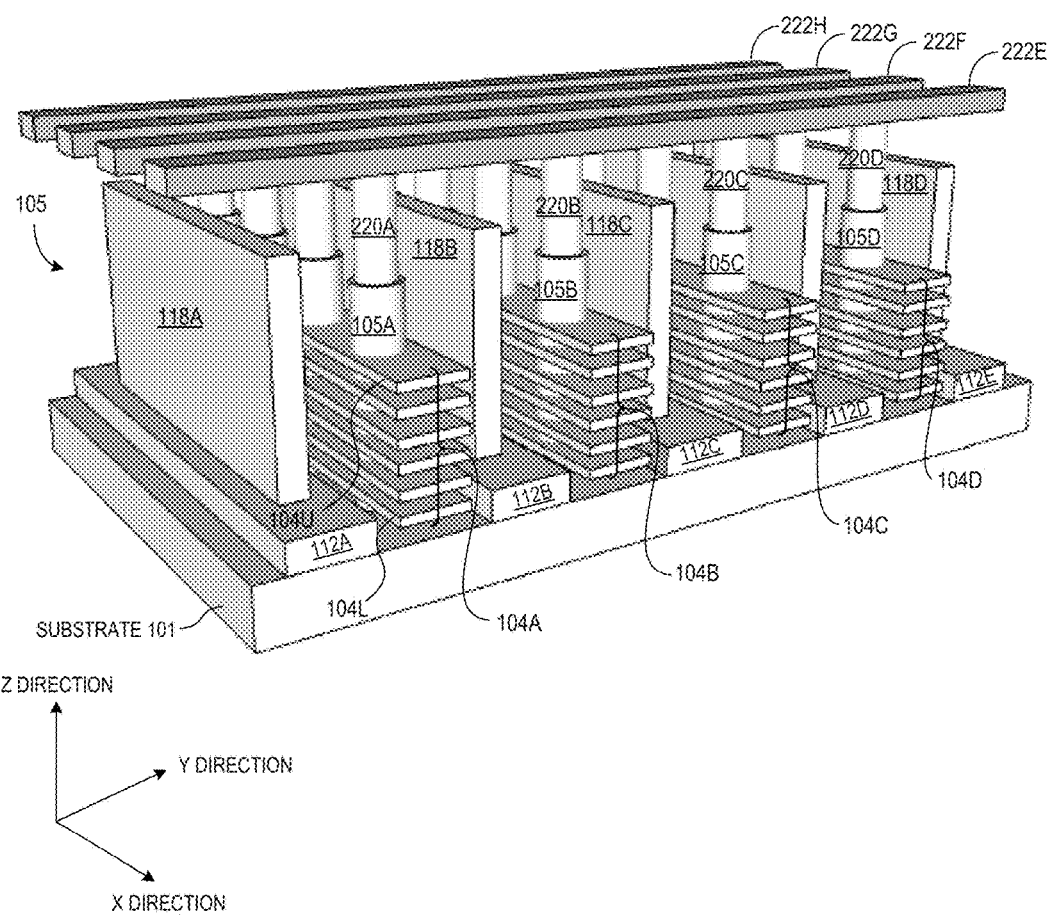
FIG. 14 illustrates a simplified perspective view of a three-dimensional vertical channel NAND flash memory array architecture in accordance with selected embodiments of the present disclosure wherein continuous source contact lines are formed along each word line direction for connection to a corresponding elevated source region.

Another example of a NAND flash memory cell array with a low resistance interconnect is shown in FIG. 14 which illustrates a simplified perspective view 201 of a three-dimensional vertical channel NAND flash memory array architecture having upper layer connection bit lines 222E-H formed over a plurality of vertical channel NAND flash cell strings 105 extending up from a substrate 101 wherein continuous source contact lines 118 are formed along each word line direction for connection to corresponding elevated source regions 112. As shown in FIG. 14, the vertical channel NAND flash memory array architecture generally shares the same structure as the VC NAND flash memory array architecture shown in FIG. 5 so that an array of NAND flash cell strings 105 is arranged in a matrix of rows and columns to extend from the chip substrate 101 and through a plurality of stacked word line conductors 104A-C to define a vertical stack of transistors along each string, each including a pillar or cylinder shaped semiconductor body and surrounding multilayered memory film structures. In addition, each row of NAND flash cell strings 105 includes an adjacent pair of elevated source regions (e.g., 112A-D) which are connected across an extended channel region formed in the chip substrate 101 to the row of NAND flash cell strings 105 which protrude or extend vertically from the substrate 101 and through separate stacks of conductive word line or gate electrode layers (e.g., 104A) separated from one another by insulating layers (not shown) for direct connection to upper layer connection bit lines (e.g., 222E) via bit line contacts (e.g., 220A-D). As a result, each cell string includes a top vertical pillar portion, a plurality of middle memory cell pillar portions, and a bottom vertical pillar portion which is directly connected across the chip substrate 101 to the elevated source regions (e.g., 112A, 112B) which protrude from the chip substrate 101.

To provide electrical contact to the source node of each string 105, FIG. 14 shows that a separate source contact 118A-D may be formed to make direct electrical or physical contact with a corresponding elevated source region 112A-D. In selected example embodiments, each source contact (e.g., 118A) may be formed after fabrication of the elevated source regions (e.g., 112A) by covering the elevated source regions 112 with one or more deposited dielectric fill layers which are then patterned and etched to form a plurality of source contact openings, each of which exposes a corresponding elevated source region (e.g., 112A). Subsequently, the source contact openings may be filled with one or more conductor layers to define the plurality elongated metal interconnect source lines 118A-D running in the word line direction which are laterally spaced apart from the vertical flash cell strings. In this way, a single, elongated shared metal interconnect source line (e.g., 118A) may be formed in direct electrical or physical contact with a corresponding elevated source region (e.g., 112A). By providing elongated shared metal interconnect source lines 118 for connection to the elevated source regions 112 of each row of NAND flash cell strings, the resistance of the source lines may be reduced. In addition, fabrication complexity is reduced by eliminating the need to form separate source contacts.

As will be appreciated, the performance benefits of employing elevated source regions to extend the lower select or access transistor channel length on cells stings can be achieved with different stacked NAND string array arrangements. For example, FIG. 5 illustrates an embodiment wherein each row of NAND flash cell strings (e.g., 105A, 105E, 105I, 105M) is formed between an adjacent pair of elevated source regions (e.g., 112A, 112B) and connected together with a vertical stack of word line gate structures (e.g., 104A) formed as gate-all-around electrodes to uniquely access the row of NAND flash cell strings (e.g., 105A, 105E, 105I, 105M). However, two or more rows of NAND flash cell strings in each array may share upper layer word line conductors while positioning an adjacent pair of elevated source regions at the base of each NAND flash cell string.

Figure 15:
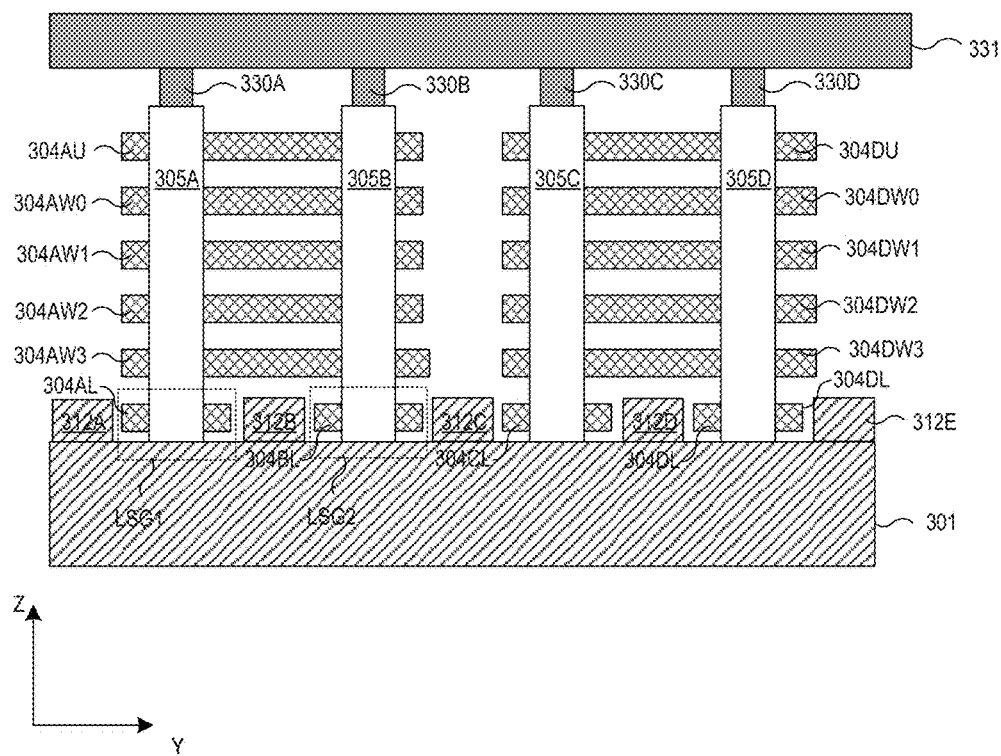
FIG. 15 illustrates a simplified cross-sectional view of a three-dimensional vertical channel NAND flash memory array architecture with each access transistor having elevated source regions formed at a substrate base of each vertical channel NAND flash cell string, wherein adjacent rows of string bodies share upper layer word lines.

An example embodiment of such an arrangement is shown in FIG. 15 which illustrates a simplified cross-sectional view 300 of a three-dimensional vertical channel NAND flash memory array architecture with each access transistor (e.g., LSG1, LSG2) having elevated source regions 312 formed at a substrate base of each vertical channel NAND flash cell string 305 with adjacent rows of string bodies (e.g., 305A, 305B) sharing word lines (e.g., 304A). The cross-sectional view 300 of the cell structures in the vertical channel NAND flash memory array is taken in the z-y plane through an upper layer connection line 331 and transistor gate word lines 304, with the direction along an x-axis referring to a direction perpendicular to the z-y plane.

As shown in the vertical cross-sectional view 300, the NAND flash strings 305A-D—which each include a string body or channel surrounded by a gate dielectric layer, memory film structure, and outermost blocking/coupling dielectric layer—extend from the substrate 301, through the stacked cell and select gate structures 304, and across bit line contacts 330A-D to the upper layer connection bit line 331. In addition, elevated source regions (e.g., 312A, 312B) are formed at the base of each NAND flash string (e.g., 305A) in direct electrical or physical contact with the substrate 301 using a suitable semiconductor material (e.g., epitaxial monocrystalline silicon, silicided polysilicon, doped silicon germanium, or the like) so as to be positioned adjacent to, but insulated from, each lower select gate electrode (e.g., 304AL) for the string's lower select gate (e.g., LSG1). Instead of providing dedicated word line stacks for each row of strings, the cross-sectional view 300 of a three-dimensional vertical channel NAND flash memory array architecture shows that a stack of word lines may be shared among two adjacent rows of string bodies while maintaining separate lower select lines for each string body. In particular, a first pair of adjacent NAND flash string rows (e.g., 305A, 305B) extends from the substrate 301 through separate lower select lines (e.g., 304AL, 304BL) which are positioned between elevated source regions 312A-C to define lower select gates (e.g., LSG1, LSG2), and also extends through a shared word line gate stack structure, including memory cell gates (e.g., 304AW0-W4) and upper select gate 304AU). In addition, a second pair of adjacent NAND flash string rows (e.g., 305C, 305D) extends from the substrate 301 through separate lower select gates (e.g., 304CL, 304DL) which are positioned between elevated source regions 312C-E, and also extends through a shared word line gate stack structure, including memory cell gates (e.g., 304DW0-W4) and upper select gate (e.g., 304DU).

To form the elevated source regions (e.g., 312B) and dedicated lower select lines (e.g., 304AL, 304BL) below the word line stack, the fabrication sequence may include an initial processing sequence for depositing, patterning, and etching a first layer of polysilicon and dielectric insulator layers on the substrate 301 to define the lower select lines (e.g., 304AL, 304BL) and expose the substrate 301 where the elevated source regions (e.g., 312B) be epitaxially grown or deposited with appropriate insulation from the lower select lines, after which additional alternating layers of polysilicon and dielectric insulator layers are deposited to form the laminated stack of gate conductor layers which may be processed to form vertical channel NAND flash strings and wrap-around patterned gate conductor layers.

As illustrated, selected NAND flash strings in a column (e.g., 305A-D) are connected across interconnect or via structures (e.g., 330A-D) to a shared upper layer connection bit line 331 which runs in the y-direction, while two adjacent rows of flash cell string (e.g., 305A, 305B) are connected to shared upper layer word line gate structures 304A, 304AW0-W3 and dedicated select gate structures 304AL, 304BL, respectively. However, it will be appreciated that more than two adjacent rows of string bodies (e.g., 4 rows) may share a common word line.

Figure 16:
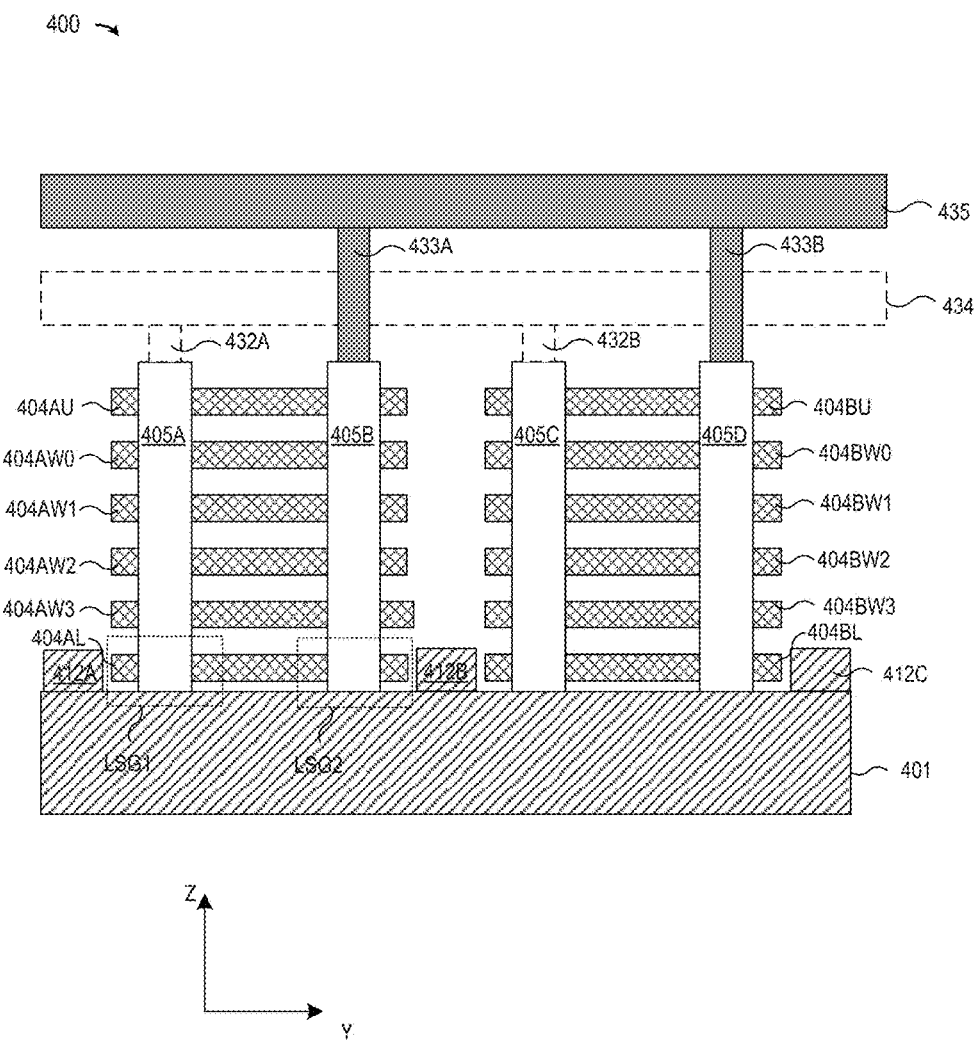
FIG. 16 illustrates a simplified cross-sectional view of a three-dimensional vertical channel NAND flash memory array architecture with elevated source regions formed at a substrate base of adjacent vertical channel NAND flash cell string rows which share word lines and select lines.

Another configuration of NAND flash cell strings is shown in FIG. 16 which illustrates a simplified cross-sectional view 400 of a three-dimensional vertical channel NAND flash memory array architecture with access transistors (e.g., LSG1, LSG2) having elevated source regions 412 formed at a substrate base of adjacent vertical channel NAND flash cell string rows (e.g., 405A, 405B) which share word lines (e.g., 404A) and select lines (e.g., 404AL, 404AU). The cross-sectional view 400 of the cell structures in the vertical channel NAND flash memory array is taken in the z-y plane through an upper layer connection line 435 and transistor gate word lines 404, with the direction along an x-axis referring to a direction perpendicular to the z-y plane. As illustrated, a first pair of non-adjacent NAND flash strings 4053, 405D extends from the substrate 401, through the stacked cell and select gate structures 404, and across bit line contacts 433A-B to the upper layer connection bit line 435. In addition, a second pair of non-adjacent NAND flash strings 405A, 405C extends from the substrate 401, through the stacked cell and select gate structures 404, and across bit line contacts 432A-B to a separate upper layer connection bit line 434. Around adjacent pairs of NAND flash strings (e.g., 405A, 405B), elevated source regions (e.g., 412A, 412B) are formed in direct electrical or physical contact with the substrate 401 using a suitable semiconductor material so as to be positioned adjacent to, but insulated from, the lower select gate electrode (e.g., 404AL) for the lower select gates (e.g., LSG1, LSG2). In this way, adjacent rows of NAND flash strings (e.g., 405A, 405B) may share a stack of word lines and select lines (e.g., 404A). In particular, a first pair of adjacent NAND flash string rows (e.g., 405A, 405B) extends from the substrate 401 and through a shared word line gate stack structure, including a lower select gate (e.g., 404AL), memory cell gates (e.g., 404AW0-W4) and upper select gate (e.g., 404AU), with elevated source regions 412A-B positioned on each side of the lower select gate (e.g., 404AL). In addition, a second pair of adjacent NAND flash string rows (e.g., 405C, 405D) extends from the substrate 401 and through a shared word line gate stack structure, including a lower select gate (e.g., 404BL), memory cell gates (e.g., 404BW0-W4) and upper select gate (e.g., 404BU), with elevated source regions 412B-C positioned on each side of the lower select gate (e.g., 404BL). As illustrated, selected NAND flash strings in a column (e.g., 405B, 405D) are connected across interconnect or via structures (e.g., 433A-B) to a shared upper layer connection bit line 435 which runs in the y-direction, while two adjacent rows of flash cell string (e.g., 405A, 405B) are connected to share word line and select line gate structures 404A. However, it will be appreciated that more than two adjacent rows of string bodies (e.g., 4 rows) may share common word and select lines. In order to avoid the situation where there are cells that share the same word line and bit line, the bit lines are connected so that any two strings (e.g., 405A, 405B) which share the same word line (e.g., 404A) are connected to different bit lines (e.g., 434, 435).

To form the elevated source regions (e.g., 412) between adjacent rows of NAND flash strings (e.g., 405A, 405B) which share word lines (e.g., 404A) and select lines (e.g., 404AL, 404AU), the fabrication sequence may be adjusted to pattern and etch the laminated stack of gate conductor layers so that the array of substrate openings down to the substrate define patterned gate conductor layers to be shared by two or more adjacent rows of strings, followed by selective formation of insulating dielectric layers on the sidewalls (but not bottom surfaces of the substrate openings) and epitaxial growth or deposition of the elevated source regions to a suitable height for overlap with the lower select or access gate transistor on each NAND flash string.

Figure 17:
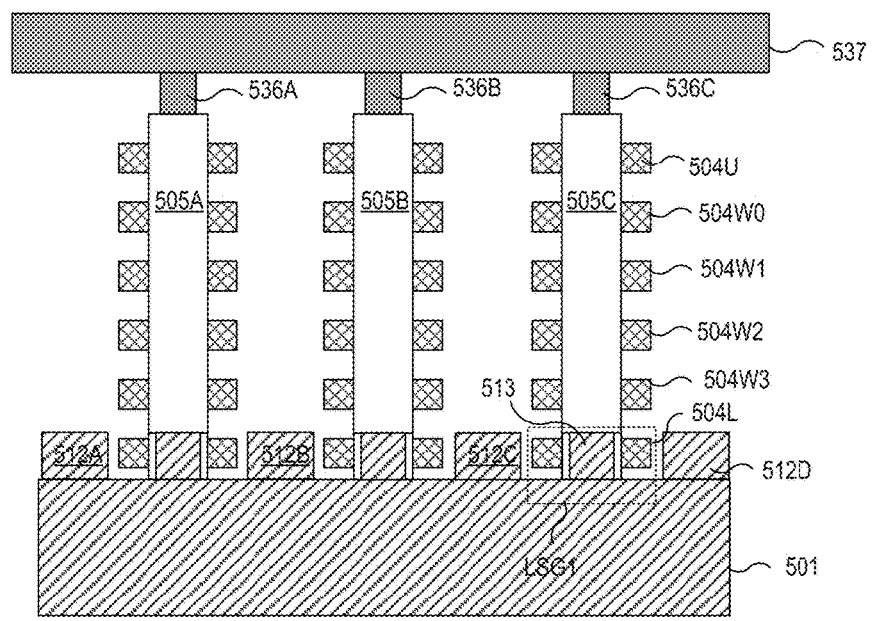
FIG. 17 illustrates a simplified cross-sectional view of a three-dimensional vertical channel NAND flash memory array architecture, wherein each vertical channel NAND flash cell string includes an access transistor formed with an elevated source region and substrate channel region protruding from the substrate.

The benefits of forming elevated source regions may also be applied to extend or lengthen the channel of the lower ground select line transistors by forming the lower body portion of each vertical pillar to include a solid semiconductor region which protrudes from the substrate and through the lower select gate. An example embodiment of such an arrangement is shown in FIG. 17 which illustrates a simplified cross-sectional view 500 of a three-dimensional vertical channel NAND flash memory array architecture, wherein each vertical channel NAND flash cell string 505 includes a lower select or access transistor (e.g., LSG1) formed with an elevated substrate channel region (e.g., 513)

protruding from the substrate 501 and surrounded by one or more source line regions 512 formed at a substrate base of each vertical channel NAND flash cell string 505. The cross-sectional view 500 of the cell structures in the vertical channel NAND flash memory array is taken in the z-y plane through an upper layer connection line 537 and transistor gate word lines 504, with the direction along an x-axis referring to a direction perpendicular to the z-y plane.

As shown in the vertical cross-sectional view 500, each NAND flash string 505 extends from the substrate 501, through the stacked cell and select gate structures 504, and across bit line contacts 536A-C to the upper layer connection bit line 537. As described above, each NAND flash string (e.g., 505C) includes a string body or channel surrounded by a gate dielectric layer, memory film structure, and outermost blocking/coupling dielectric layer. However, the lower body portion of each vertical string pillar includes a solid semiconductor region (e.g., 513) which protrudes from the substrate 501 and through the lower select gate (e.g., 504L). Formed at the base of each NAND flash string (e.g., 505C), the elevated substrate channel region 513 is formed in direct electrical or physical contact with the substrate 501 using a suitable semiconductor material (e.g., epitaxial monocrystalline silicon) so as to be surrounded by, but insulated from, each lower select gate electrode (e.g., 504L) for the string's lower select gate (e.g., LSG1). In addition, elevated source regions (e.g., 512C, 512D) are formed at the base of each NAND flash string (e.g., 505C) in direct electrical or physical contact with the substrate 501 using a suitable semiconductor material (e.g., epitaxial monocrystalline silicon, silicided polysilicon, doped silicon germanium, or the like) so as to be positioned adjacent to, but insulated from, each lower select gate electrode (e.g., 504L) for the string's lower select gate (e.g., LSG1). After forming the lower select gate electrodes (e.g., 504L), elevated substrate channel regions (e.g., 513), and elevated source regions (e.g., 512C-D), a stack of word line and select line gate conductors are sequentially deposited, patterned and etched to form memory holes in which the remainder of each string 505 is formed to include a string body or channel in electrical or physical contact with the elevated substrate channel regions (e.g., 513). In addition, the stack of word line and select line gate conductors are patterned and etched to define patterned gate conductor layers 504W0-W3, 504U) to extend in the x-direction around each row of strings 505.

By now it should be appreciated that there is provided herein a three-dimensional integrated circuit nonvolatile memory device with access transistors using elevated source regions to form elongated access transistor channel regions. The disclosed NVW device includes a nonvolatile memory array formed over a substrate of a first conductivity type (e.g., a p-type implanted well formed at a surface of an n-type substrate). The nonvolatile memory array includes a plurality of memory cell pillars formed over and extending from the substrate and an access transistor located at the bottom of each memory cell pillar. Each access transistor includes a drain formed in said memory cell pillar; a vertical channel body portion of the memory cell pillar connected between the drain and the substrate; an elevated source region connected to protrude from a top surface of the substrate and extend parallel to the surface of the substrate so as to be adjacent to the vertical channel body portion; a horizontal channel body portion formed in the substrate between the vertical channel body portion and the elevated source region; and a lower select line gate electrode formed around the bottom of said memory cell pillar to be insulated from and at least partially positioned between the vertical channel body and the elevated source region for said memory cell pillar. In addition, the vertical channel body portion may include an elevated substrate channel region connected to protrude from the substrate. In selected embodiments, a plurality of elevated source regions may be formed to run perpendicular to a bit line direction on both sides of each memory cell pillar, while in other embodiments, each elevated source region may be formed to run perpendicular to a bit line direction on only one side of each memory cell pillar. Each nonvolatile memory array may be embodied as a NAND flash memory array in which the memory cell pillars are formed as a plurality of NAND flash strings, each string having a vertical channel string body connected between the substrate and an upper layer connection bit line which extends parallel to the surface of the substrate. In addition or in the alternative, each memory cell pillar may include a plurality of series-connected transistors formed along a corresponding vertical channel body portion between the substrate and an upper layer connection bit line. The series-connected transistors may include an upper access transistor and a plurality of memory cell transistors connected between the upper and lower access transistors. In embodiments where a conductive source is formed in an upper portion of each elevated source region, the access transistor includes an extended channel region which includes the vertical channel body portion, the horizontal channel body portion, and a bottom portion of the elevated source region. However, in embodiments where substantially the entirety of the elevated source region forms the conductive source, the access transistor includes an extended channel region which includes the vertical channel body portion and the horizontal channel body portion. In selected embodiments, the NVM device may include a plurality of source contacts connecting the elevated source region to a shared metal interconnect source line which may run in the word line direction. In other embodiments, the NVM device may include an elongated, plate-shaped metal interconnect source line running in the word line direction and connected to the elevated source region. In selected embodiments, the elevated source region may be formed with monocrystalline silicon grown from the substrate, polycrystalline silicon deposited directly on the substrate, and/or epitaxial silicon germanium, all or part of which may be doped or silicided to form a conductive source. In addition, each memory cell pillar may include a hollow cylinder-shaped semiconductor body surrounding a non-conductive dielectric core and/or a solid cylinder-shaped semiconductor body. For example, the vertical channel body for the plurality of series-connected transistors may be formed with a hollow cylinder-shaped semiconductor body surrounding a non-conductive dielectric core, and the vertical channel body portion for the lower access transistor may be formed with a solid cylinder-shaped semiconductor body.

In another form, there is provided a nonvolatile memory device and associated fabrication process. The disclosed integrated circuit device includes a plurality of storage cells vertically stacked over a lower access transistor in a pillar extending perpendicular to a substrate surface. As formed, the lower access transistor includes a channel with a first channel portion and a second channel portion adjacent to the first channel portion. The first channel portion is formed in the pillar to extend in the first direction, and the second channel portion is formed in the substrate to extend in a second direction substantially parallel to the substrate surface. In selected embodiments, the channel of the lower access transistor may also include a third channel portion adjacent to the second channel portion, the third channel portion formed outside the pillar in an elevated region formed with epitaxial or polycrystalline semiconductor material to extend from the substrate in the first direction. The access transistor may also include a conductive source or drain region located at least partially in the elevated region protruding from the substrate surface.

In yet another form, there is provided a method for forming a semiconductor device. In the disclosed methodology, a laminated stack of insulated gate conductor layers is formed over a substrate, and a plurality of memory cell pillars is formed extending from the substrate and through the insulated gate conductor layers. Before or after forming the memory cell pillars, the laminated stack is selectively etched to form an array of substrate openings down to the substrate and to define a patterned select gate conductor line for an access transistor located at the bottom of each memory cell pillar. In the substrate openings, one or more insulating dielectric layers are selectively formed on sidewall surfaces but not bottom surfaces of the substrate openings, thereby forming a first opening in each substrate opening which exposes the substrate. Thereafter, an elevated source region is formed in each first opening in contact with the substrate to a suitable height for overlap with the select gate conductor line such that the access transistor has a first channel portion that runs perpendicular to the surface of the substrate through the memory cell pillar, a second channel portion that runs parallel to the surface of the substrate through the substrate, and a third channel portion that runs perpendicular to the surface of the substrate through the elevated source region. In selected embodiments, the elevated source region is formed with monocrystalline silicon grown from the substrate, polycrystalline silicon deposited directly on the substrate, or epitaxial silicon germanium. In addition, the elevated source region may be processed to form an n-type conductive region in an upper portion of the elevated source region and/or to form a silicide layer in an upper portion of the elevated source region.

Although the described exemplary embodiments disclosed herein are directed to various nonvolatile memory device structures and methods for making and operating same by forming elevated source regions and/or elevated substrate channel regions protruding from the substrate at or around the base of each NAND flash cell string where a select transistor is located, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the NAND cell transistors are described as n-channel transistors on p-type (or undoped) channel material, this is merely for illustration purposes, and it will be appreciated that n and p-type impurities may be interchanged so as to form p-channel transistors on n-type channel material or n-channel transistors on lightly doped n-type channel material. In addition, the memory cells are illustrated herein as being embodied as vertical channel NAND memory cell strings, but this is merely for convenience of explanation and not intended to be limiting and persons of skill in the art will understand that the principles taught herein apply to other suitable kinds of cell structures and the resulting different bias conditions. For example, the memory cell strings may be embodied with any type nonvolatile memory, including but not limited to resistive RAM, phase-change memory, and the like. It will also be appreciated that the disclosed cell array scheme for read, program, and erase operations is not tied to any specific cell technology. For example, the figures illustrate examples in which there are sixteen vertical channel NAND strings which each have four memory cells and two select gate transistors; however, other embodiments are not restricted to any specific number of strings or transistors, and even work for single layer cell arrays. It will also be appreciated that gate-all-around devices are not required in all embodiments, and that the stacked gate electrodes may be formed by locating gate electrodes on only two opposing sides of the string or pillar structures. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Thus, many more embodiments and modifications other than the described ones are possible. These may include combinations of the described embodiments. It should also be noted that the present disclosure uses terms, like bit lines, source lines, word lines, etc., to refer to the specific function and electrical operation of the memory device, but selected embodiments of the present disclosure can also be applied for different functions and operations. In these cases, the described metal interconnections may have functions other than bit lines, source lines, etc. and come under different names. Also the terms "source" and "drain" have been used for specifying certain elements in the structure, but should not be understood in a restrictive term as to refer only to certain types of electrical polarities. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," "includes," "including," "has," "having" or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:
1. A nonvolatile memory device, comprising:
a nonvolatile memory array comprising a plurality of memory cell pillars extending from a substrate with an access transistor located at the bottom of each memory cell pillar, the access transistor comprising:
a drain in said memory cell pillar,
a vertical channel body portion of said memory cell pillar connected between the drain and the substrate, an elevated source region protruding from a top surface of the substrate and being adjacent to the vertical channel body portion, a horizontal channel body portion formed in the substrate between the vertical channel body portion and the elevated source region, and a lower select line gate electrode formed around the bottom of said memory cell pillar to be insulated from and at least partially positioned between the vertical channel body and the elevated source region for said memory cell pillar, the elevated source region being confined within a region shifted laterally from the vertical channel body portion along the top surface of the substrate, such that the lower select line gate electrode is intervening between the vertical channel body portion and the elevated source region.

2. The nonvolatile memory device of claim 1, where the nonvolatile memory array comprises a NAND flash memory array in which the plurality of memory cell pillars comprises a plurality of NAND flash strings, each string comprising:

a vertical channel string body connected between the substrate and an upper layer connection bit line which extends parallel to the surface of the substrate; and a plurality of series-connected transistors formed along a each vertical channel body portion between the substrate and the upper layer connection bit line, where the plurality of series-connected transistors comprises an upper access transistor and a plurality of memory cell transistors connected between the upper access transistor and a lower access transistor.

3. The nonvolatile memory device of claim 1, where an upper portion of each elevated source region comprises a conductive source, thereby defining an extended channel region for the access transistor comprising the vertical channel body portion, the horizontal channel body portion, and a bottom portion of the elevated source region.

4. The nonvolatile memory device of claim 1, where substantially all of the elevated source region comprises a conductive source, thereby defining an extended channel region for the access transistor comprising the vertical channel body portion and the horizontal channel body portion.

5. The nonvolatile memory device of claim 1, where the nonvolatile memory array comprises a plurality of elevated source regions running perpendicular to a bit line direction on both sides of each memory cell pillar.

6. The nonvolatile memory device of claim 1, where the nonvolatile memory array comprises a plurality of elevated source regions, with each elevated source region running perpendicular to a bit line direction on only one side of each memory cell pillar.

7. The nonvolatile memory device of claim 1, further comprising a plurality of source contacts connecting the elevated source region to a shared metal interconnect source line.

8. The nonvolatile memory device of claim 1, further comprising an elongated, plate-shaped metal interconnect source line running in the word line direction and connected to the elevated source region.

9. The nonvolatile memory device of claim 1, where the vertical channel body portion in each memory cell pillar comprises an elevated substrate channel region connected to protrude from the substrate.

10. The nonvolatile memory device of claim 1, where the elevated source region comprises monocrystalline silicon grown from the substrate.

11. The nonvolatile memory device of claim 1, where the elevated source region comprises polycrystalline silicon deposited directly on the substrate.

12. The nonvolatile memory device of claim 1, where the elevated source region comprises epitaxial silicon germanium.

13. The nonvolatile memory device of claim 1, where each memory cell pillar comprises a hollow cylinder-shaped semiconductor body surrounding a non-conductive dielectric core.

14. The nonvolatile memory device of claim 1, where each memory cell pillar comprises a solid cylinder-shaped semiconductor body.

15. The nonvolatile memory device of claim 2, where the corresponding vertical channel body for the plurality of series-connected transistors comprises a hollow cylinder-shaped semiconductor body surrounding a non-conductive dielectric core, and where the vertical channel body portion for the lower access transistor comprises a solid cylinder-shaped semiconductor body.

16. The nonvolatile memory device of claim 1, further comprising an n-type conductive region located in an upper portion of the elevated source region.

17. The nonvolatile memory device of claim 1, further comprising a silicide layer located in an upper portion of the elevated source region.

18. A nonvolatile memory device comprising a plurality of storage cells vertically stacked over a lower access transistor in a pillar extending perpendicular to a substrate surface, the lower access transistor in an on-state having a conductive channel formed in a U-shape wrapping around three sides of a gate electrode of the lower access transistor with only a gate dielectric intervening between the channel and the gate electrode, the conductive channel comprising a vertical first channel portion formed in the pillar to extend perpendicularly from the substrate surface, a horizontal second channel portion adjoining the first channel portion and formed in the substrate underneath the gate electrode to extend along the substrate surface, and a third channel portion adjoining the second channel portion and extending perpendicularly from the substrate and formed outside the pillar in an elevated region comprising epitaxial or polycrystalline semiconductor material, the elevated region protruding from the substrate surface and being laterally shifted from the pillar such that the gate electrode of the lower access transistor is intervening between the first channel portion and the elevated region.

19. The nonvolatile memory device of claim 18, where the access transistor has a conductive source or drain region located at least partially in the elevated region protruding from the substrate surface.

* * * * *